(12) United States Patent
Yeh et al.

(10) Patent No.: US 7,397,701 B2
(45) Date of Patent: Jul. 8, 2008

(54) METHOD AND APPARATUS FOR OPERATING A STRING OF CHARGE TRAPPING MEMORY CELLS

(75) Inventors: Chih Chieh Yeh, Taipei (TW); Wen Jer Tsai, Hualien (TW); Yi Ying Liao, Sijhih (TW)

(73) Assignee: Macronix International Co., Ltd., Hsinchu (TW)

( * ) Notice: Subject to any disclaimer, the term of this patent is extended or adjusted under 35 U.S.C. 154(b) by 73 days.

(21) Appl. No.: 11/279,720

(22) Filed: Apr. 13, 2006

(65) Prior Publication Data

US 2007/0140010 A1 Jun. 21, 2007

Related U.S. Application Data

(63) Continuation-in-part of application No. 11/315,783, filed on Dec. 21, 2005, now abandoned.

(30) Foreign Application Priority Data

Jan. 5, 2006 (TW) ............................... 95100529 A

(51) Int. Cl.
*G11C 16/04* (2006.01)
(52) U.S. Cl. ............................ 365/185.18; 365/185.17; 365/185.25
(58) Field of Classification Search ............ 365/185.17, 365/185.18, 185.25, 185.33
See application file for complete search history.

(56) References Cited

U.S. PATENT DOCUMENTS

| | | | |
|---|---|---|---|
| 5,859,394 A * | 1/1999 | Seehaus et al. ............. 181/282 |
| 6,657,894 B2 * | 12/2003 | Yeh et al. ................ 365/185.16 |
| 6,690,601 B2 | 2/2004 | Yeh et al. |
| 6,914,819 B2 | 7/2005 | Yeh et al. |
| 6,996,011 B2 | 2/2006 | Yeh et al. |
| 2005/0226054 A1 * | 10/2005 | Yeh et al. ................ 365/185.28 |

* cited by examiner

*Primary Examiner*—Gene N. Auduong
(74) *Attorney, Agent, or Firm*—Kenta Suzue; Haynes Beffel & Wolfeld LLP

(57) ABSTRACT

An array of charge trapping nonvolatile memory cells is arranged in several columns of cells, each arranged in a series, such as a NAND string. Each cell stores no more than a single charge storage state.

36 Claims, 19 Drawing Sheets

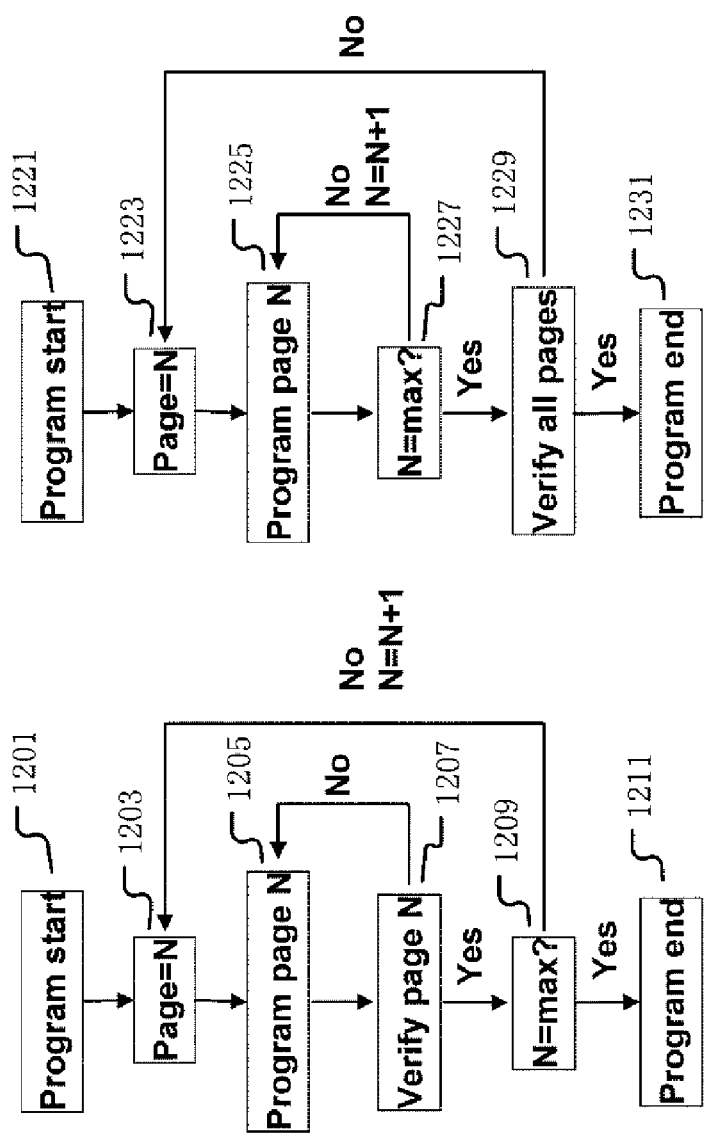
Fig. 12C
Fig. 12B
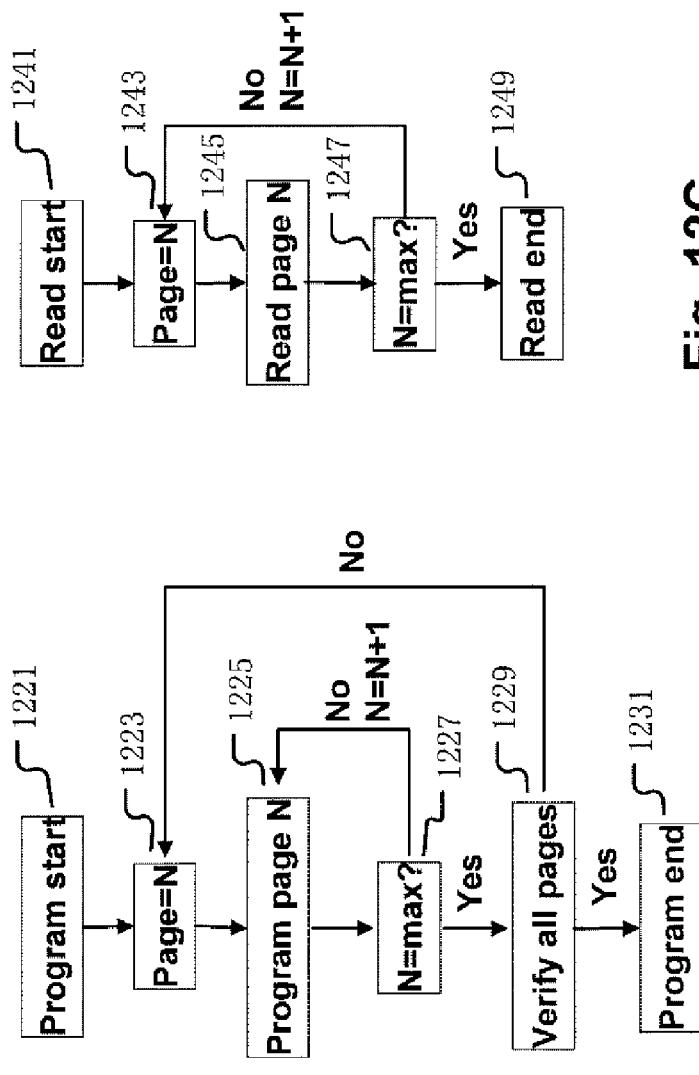
Fig. 12A

METHOD AND APPARATUS FOR OPERATING A STRING OF CHARGE TRAPPING MEMORY CELLS

RELATED APPLICATIONS

This application is a continuation-in-part of U.S. application Ser. No. 11/315,783 filed 21 Dec. 2005. This application also claims foreign priority under 35 USC 119 from Taiwanese application no. 95100529 filed on 5 Jan. 2006. All these applications are hereby incorporated by reference.

BACKGROUND OF THE INVENTION

1. Field of the Invention

The present invention relates to electrically programmable and erasable non-volatile memory, and more particularly to charge trapping memory with limited charge storage states per charge trapping memory cell.

2. Description of Related Art

Electrically programmable and erasable non-volatile memory technologies based on charge storage structures known as flash memory are used in a variety of modern applications. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry name PHINES, for example. These memory cell structures store data by trapping charge in a charge trapping dielectric layer, such as silicon nitride. As negative charge is trapped or positive charge is removed, the threshold voltage of the memory cell increases. Conversely, the threshold voltage of the memory cell is reduced by removing negative charge from the charge trapping layer or adding positive charge to the charge trapping layer.

Charge trapping memory cell structures such as PHINES take advantage of the localized charge storage nature of charge trapping, by storing multiple charge storage states. Unlike the floating gate structure, which is an essentially equipotential structure with material such as polysilicon, localized charge storage materials are not equipotential, and can store different amounts of charge in distinct portions of the same charge storage structure. Thus, a single charge trapping memory cell can store, for example, two distinct charge storage states—one physically located by the source of the memory cell, and another physically located by the drain of the memory cell.

However, the scalability of such PHINES structures may be more limited, because the multiple charge storage states of a single memory cell will interact with each other, despite being separated physically in the same charge storage structure. This interaction between multiple charge storage states of a single memory cell will worsen as the size of memory cells shrinks.

Although the PHINES structure with multiple charge storage states of a single memory cell is less scalable, the charge trapping structure of the memory cell with its localized charge storage nature remains advantageous, because less charge is required to program a particular memory cell. Unlike equipotential structures such as floating gates, programmed charge added to a charge trapping structure will not diffuse automatically throughout an entire charge storage structure, which allows changes in the charge storage state of a charge trapping structure to be effected with less total charge.

Thus, a need exists for a nonvolatile memory cell which takes advantage of the localized charge storage nature of charge trapping memory cells, without suffering the scalability issues resulting from storing multiple charge storage states in a single nonvolatile memory cell.

SUMMARY OF THE INVENTION

A method of operating strings of charge trapping memory cells with at most a single charge storage state, an architecture for an integrated circuit including such memory cells, and a method of manufacturing such memory, are provided.

A nonvolatile memory according to the described technology comprises logic, word lines, and a memory array including multiple columns. The memory cells of the array can be p-channel devices or n-channel devices Each column includes multiple memory cells arranged in a series having a first end and a second end. Each memory cell has at most a single charge storage state, and includes a substrate region including source and drain regions, a charge trapping structure storing the single charge storage state, and one or more storage dielectric structures.

The single charge storage state stores one of two logical states. In multi-level cell embodiments, the single charge storage state stores one of at least four logical states. The storage dielectric structures are at least partly between the charge trapping structure and the substrate region, and at least partly between the charge trapping structure and a source of gate voltage. The word lines are coupled to the storage dielectric structures, and act as the source of gate voltage to the memory array. The logic is coupled to the memory cells, and the logic applies bias arrangements to the memory array to program, erase, and read the memory array.

Various embodiments include bit lines, each coupled to the first end of a corresponding column. The logic applies a program bias arrangement to the memory array to program memory cells of the memory array in multiple columns, or a read bias arrangement to read memory cells in multiple columns.

The bit lines may be divided into multiple pages. Each page includes memory cells accessed by any bit line in the page. The logic applies a program bias arrangement to the memory array to program memory cells of the memory array in at least one page, or a read bias arrangement to read memory cells in at least one page.

Some embodiments include a voltage source coupled to the second end of each column, opposite from the first end coupled to the bit line. The logic determines the single charge storage state of memory cells of the memory array by sensing current in the bit lines. In various embodiments, the program bias arrangement applied by the logic to the memory array programs memory cells of the memory array via: 1) injection of carriers along a direction from the first end of the columns to the second end of the columns but not along a direction from the second end of the columns to the first end of the columns; 2) injection of carriers along a direction from the second end of the columns to the first end of the columns but not along a direction from the first end of the columns to the second end of the columns; and 3) via injection of carriers along a first direction from the first end of the columns to the second end of the columns and a second direction from the second end of the columns to the first end of the columns.

In some embodiments, the size of each memory cell is no more than 0.5 μμm.

In some embodiments, the substrate region is a well in a semiconductor substrate. In other embodiments, the substrate region is simply the semiconductor substrate.

The program operation occurs via hot hole injection or via electron injection. More generally, the logic applies one bias arrangement to adjust the charge storage state by increasing a net positive charge in the charge trapping structure, and applies another bias arrangement to adjust the charge storage state by increasing a net negative charge in the charge trapping structure. Net positive charge is increased in the charge trapping structure via current mechanisms such as band-to-band hot hole tunneling. Net negative charge is increased in the charge trapping structure via current mechanisms such as electron tunneling, Fowler-Nordheim tunneling, channel hot electron injection current, and channel initiated secondary electron injection current.

Other embodiments of the technology described above include a method for operating a memory array, and a method of manufacturing nonvolatile memory according to the described technology.

Other aspects and advantages of the technology presented herein can be understood with reference to the figures, the detailed description and the claims, which follow.

BRIEF DESCRIPTION OF THE DRAWINGS

FIG. 12A-C shows example flowcharts that implement algorithms for performing program and read operations on an array of multiple NAND strings belonging to N pages with nonvolatile charge trapping memory cells that have at most a single charge storage state.

DETAILED DESCRIPTION

Figure 1:
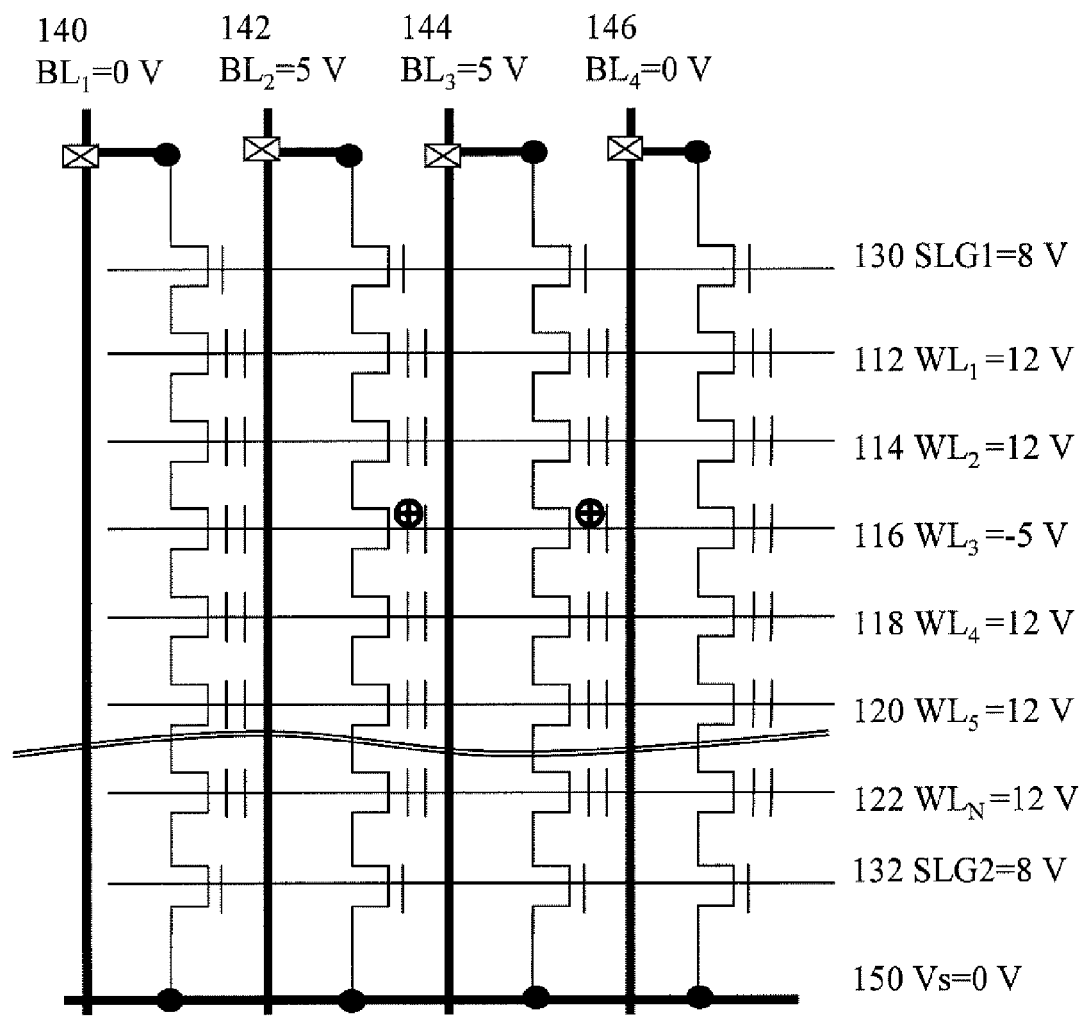
FIG. 1 shows an array of multiple NAND strings with nonvolatile charge trapping memory cells that have at most a single charge storage state undergoing a program operation with holes.

FIG. 1 shows an array of multiple NAND strings with nonvolatile charge trapping memory cells that have at most a single charge storage state undergoing a program operation with holes. The shown array includes four strings, or four columns, of charge trapping memory cells, with each column having a first end terminating with a first row of select transistors SLG1 130 with gates biased at 8 V and having a second end terminating with a second row of select transistors SLG2 132 with gates biased at 8 V. The contents of the array are accessed via bit lines BL1 140 biased at 0 V, BL2 142 biased at 5 V, BL3 144 biased at 5 V, and BL4 146 biased at 0 V, each coupled to the first end of a corresponding column of charge trapping memory cells. The second ends of the columns of charge trapping memory cells are coupled to a voltage source 150 biased at 0 V. The four columns of charge trapping memory cells are also controlled by multiple rows of N word lines including WL1 112 biased at 12 V, WL2 114 biased at 12 V, WL3 116 biased at −5 V, WL4 118 biased at 12 V, WL5 120 biased at 12 V, and WLN 122 biased at 12 V. The selected word line, WL3 116, may be biased between −3 V and −12 V in other embodiments. The unselected word lines, WL1 112, WL2 114, WL4 118, WL5 120, and WLN 122, and select transistor rows SLG1 and SLG2 are biased to pass the voltages of voltage source 150 and of the bit lines BL1 140, BL2 142, BL3 144, and BL4 146 to the selected word line of memory cells. With memory cells of the selected word line WL3 116, the voltage difference between the bit lines and the voltage source 150 controls whether programming occurs. Because of the voltage difference between the voltage source 150 and the bit lines BL2 142 and BL3 144, the nonvolatile memory cells at the intersection of the word line WL3 116 and the bit lines BL2 142 and BL3 144 are programmed via band-to-band hot hole injection. Because of the respective biases of the bit lines BL2 142 and BL3 144 and the voltage source 150, the hot holes move along a general direction from the voltage of the bit lines toward the voltage source 150. Thus, the hot holes program a part of the charge storage material of the respective memory cells closer to the bit line voltages and further from the voltage source.

Figure 2:
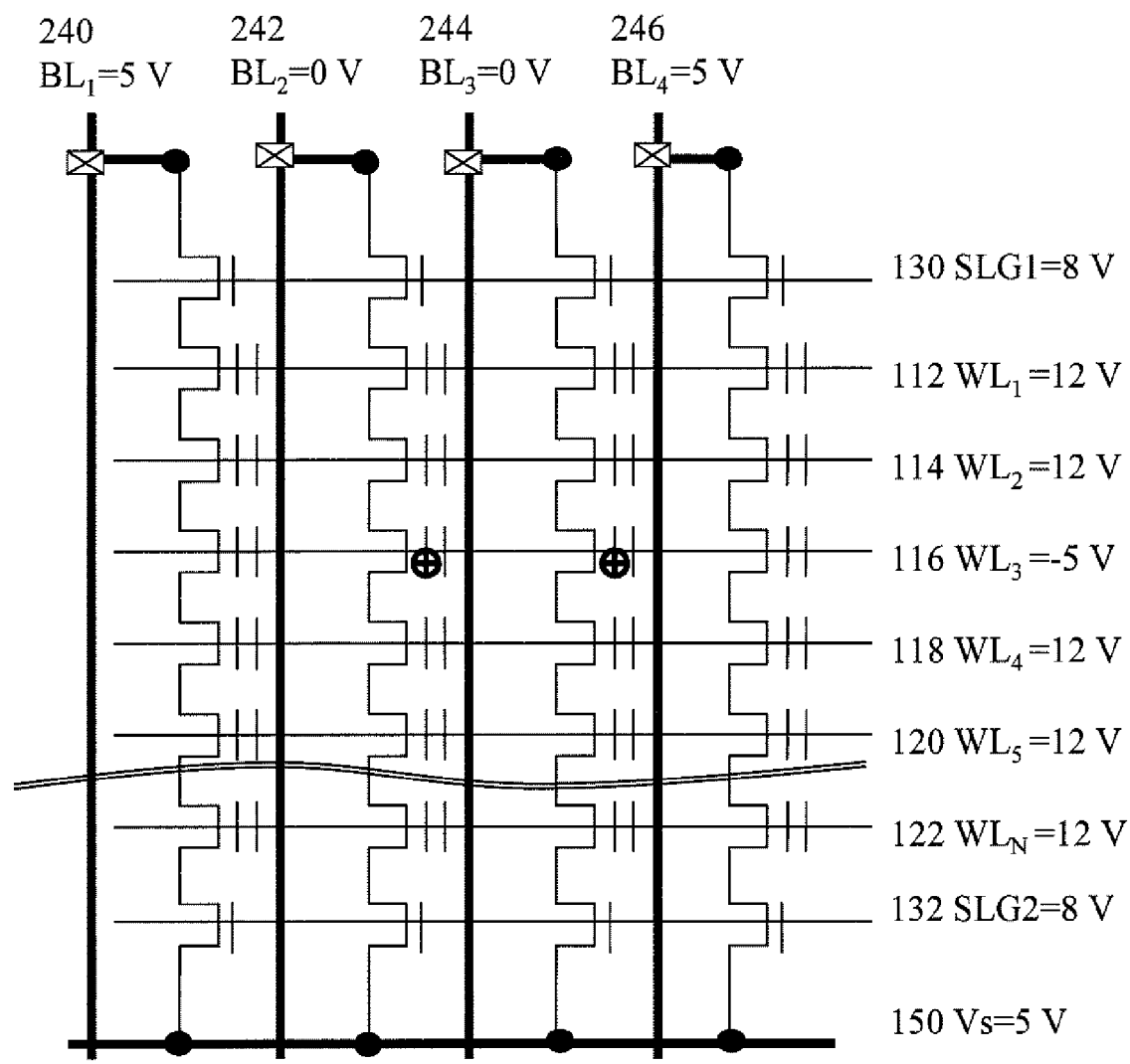
FIG. 2 shows an array of multiple NAND strings with nonvolatile charge trapping memory cells similar to FIG. 1, but that have at most a single charge storage state undergoing a program operation with holes at a different part of the charge trapping structure than in FIG. 1.

FIG. 2 shows an array of multiple NAND strings with nonvolatile charge trapping memory cells similar to FIG. 1, but that have at most a single charge storage state undergoing a program operation with holes at a different part of the charge trapping structure than in FIG. 1. The difference in the bias arrangement of FIG. 2 from FIG. 1 is in the bit lines and the voltage source. The new bias arrangement includes bit lines BL1 240 biased at 5 V, BL2 242 biased at 0 V, BL3 244 biased at 0 V, and BL4 246 biased at 5 V. The new bias arrangement also includes the voltage source 150 biased at 5 V. Because of the respective biases of the bit lines BL2 242 and BL3 244 and the voltage source 150, the hot holes move along a general direction from the voltage source 150 toward the voltage of the bit lines. Thus, the hot holes program a part of the charge storage material of the respective memory cells closer to the voltage source and further from the bit line voltages.

Figure 3:
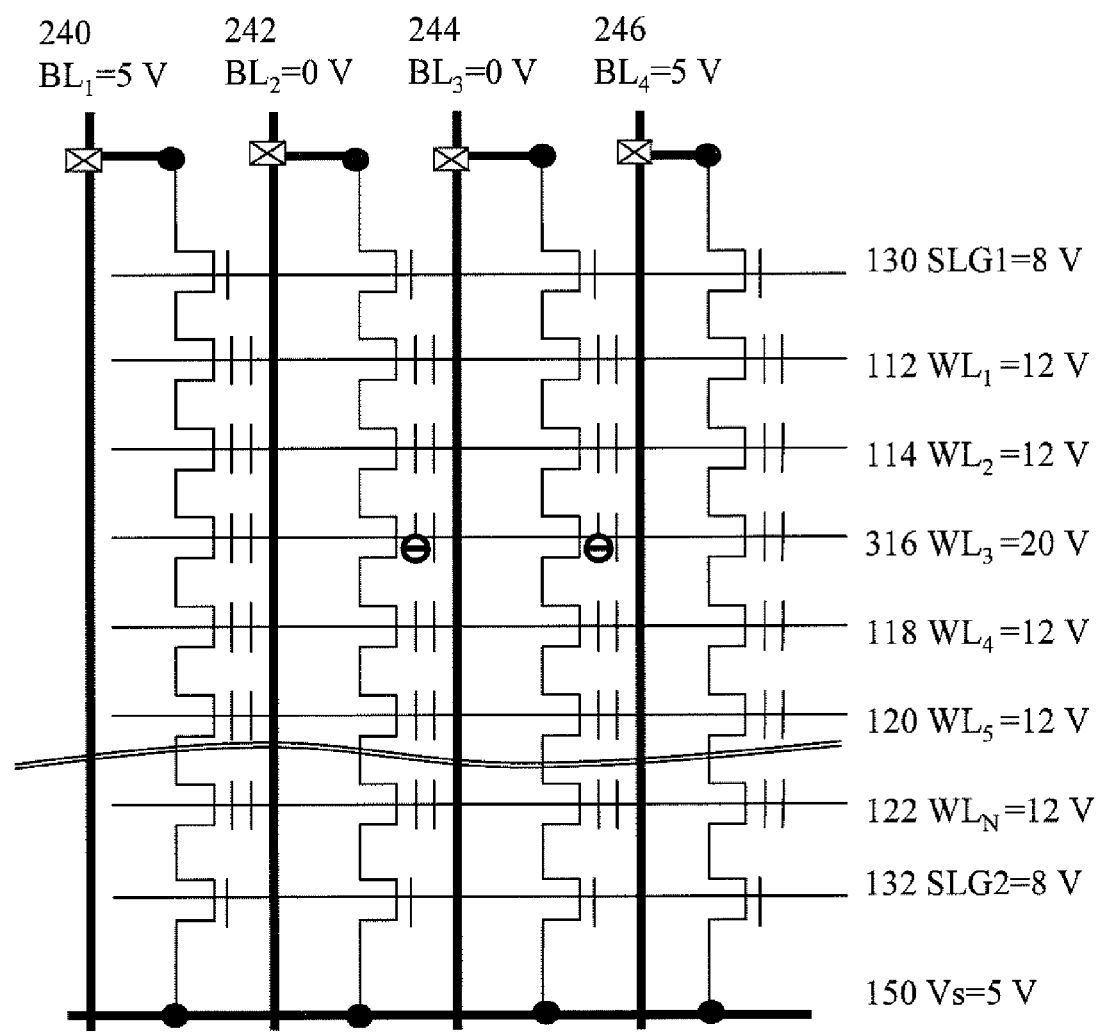
FIG. 3 shows an array of multiple NAND strings with nonvolatile charge trapping memory cells have at most a single charge storage state similar to FIG. 2, but undergoing a program operation with electrons.

FIG. 3 shows an array of multiple NAND strings with nonvolatile charge trapping memory cells have at most a single charge storage state similar to FIG. 2, but undergoing a program operation with electrons. The difference in the bias arrangement of FIG. 3 from FIG. 2 is in the selected word line, such that WL3 316 is biased at 20 V. Because of the respective biases of the bit lines BL2 242 and BL3 244 and the voltage source 150, the hot electrons move along a general direction from the voltage of the bit lines toward the voltage source 150. Thus, the hot electrons program a part of the charge storage material of the respective memory cells closer to the voltage source and further from the bit line voltages.

Figure 4:
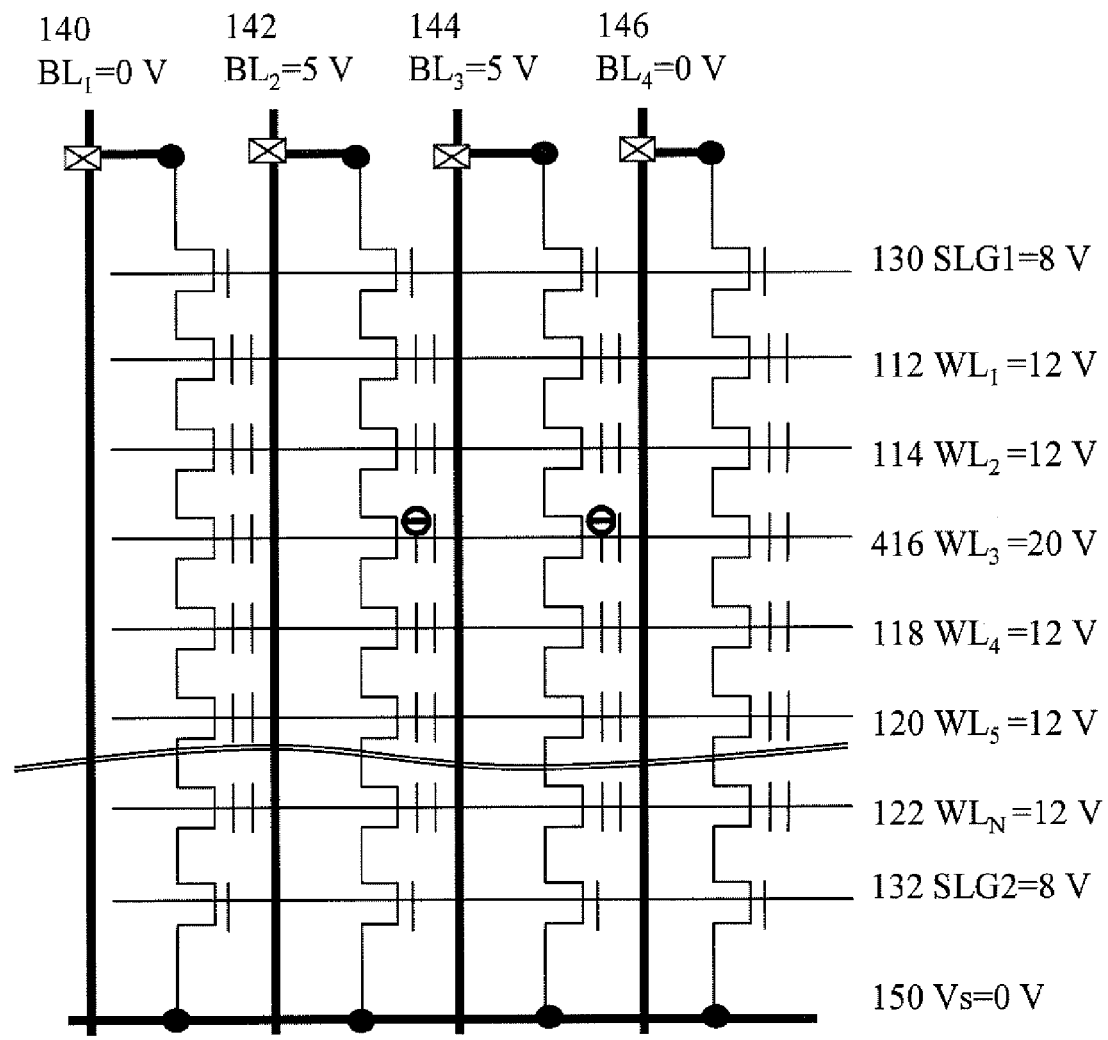
FIG. 4 shows an array of multiple NAND strings with nonvolatile charge trapping memory cells have at most a single charge storage state similar to FIG. 1 but undergoing a program operation with electrons.

FIG. 4 shows an array of multiple NAND strings with nonvolatile charge trapping memory cells have at most a single charge storage state similar to FIG. 1, but undergoing a program operation with electrons. The difference in the bias arrangement of FIG. 4 from FIG. 1 is in the selected word line, such that WL3 416 is biased at 20 V. Because of the respective biases of the bit lines BL2 142 and BL3 144 and the voltage source 150, the hot electrons move along a general direction from the voltage of the voltage source 150 toward the bit lines. Thus, the hot electrons program a part of the charge storage material of the respective memory cells closer to the bit line voltages and further from the voltage source.

Figure 5:
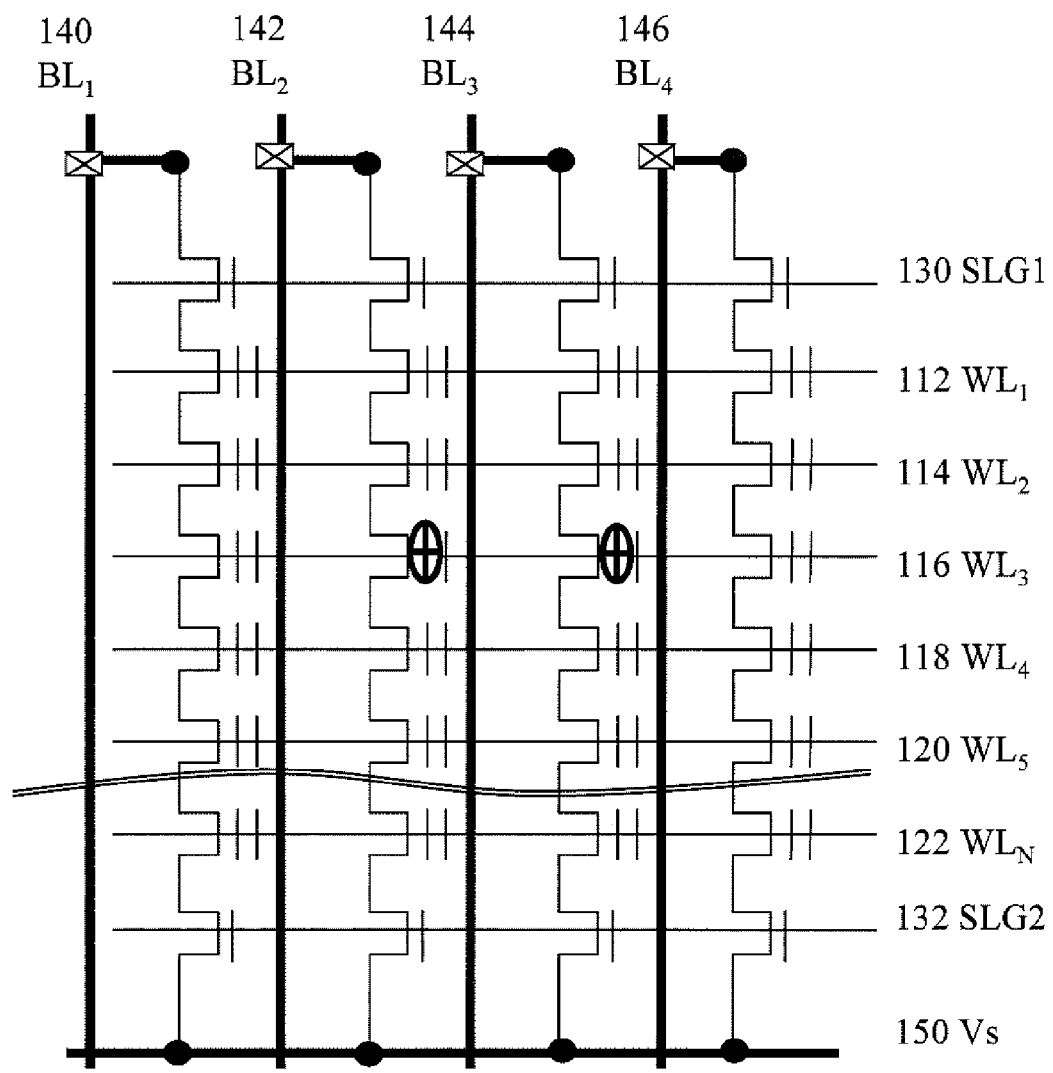
FIG. 5 shows an array of multiple NAND strings with nonvolatile charge trapping memory cells that have at most a single charge storage state similar to FIGS. 1 and 2, despite undergoing program operations with charge (shown as holes) from different directions.

FIG. 5 shows an array of multiple NAND strings with nonvolatile charge trapping memory cells that have at most a single charge storage state similar to FIGS. 1 and 2, despite undergoing program operations with charge (shown as holes) from different directions. The size of the charge storage material is sufficiently small, such that there will be only a single charge storage state, despite the localized charge storage nature of the charge storage material.

Figure 6:
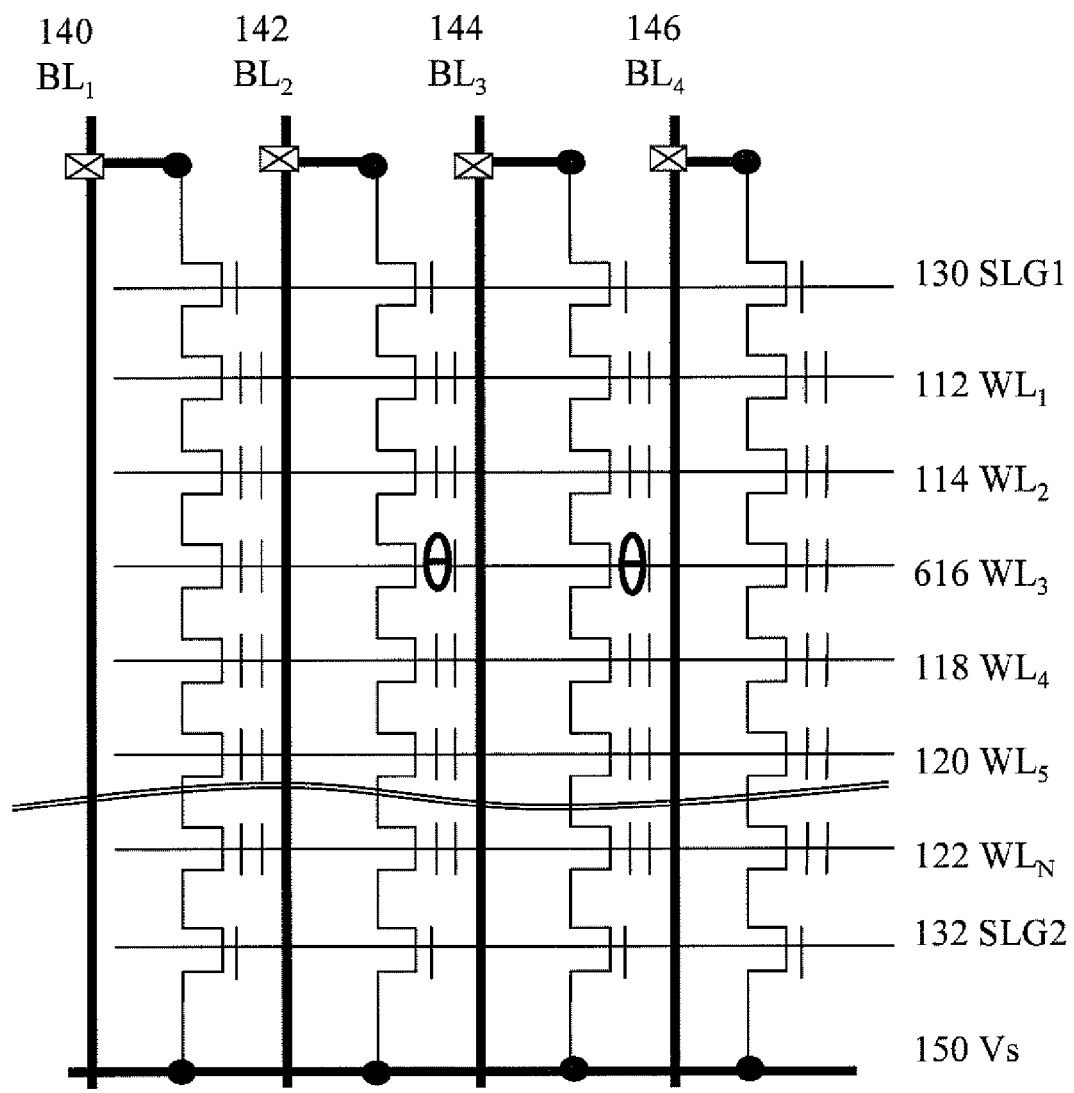
FIG. 6 shows an array of multiple NAND strings with nonvolatile charge trapping memory cells that have at most a single charge storage state despite being undergoing program operations with charge from different directions similar to FIG. 5, but with electrons.

FIG. 6 shows an array of multiple NAND strings with nonvolatile charge trapping memory cells that have at most a single charge storage state despite being undergoing program operations with charge from different directions similar to FIG. 5, but with electrons. The size of the charge storage material is sufficiently small, such that there will be only a single charge storage state, despite the localized charge storage nature of the charge storage material.

Figure 7:
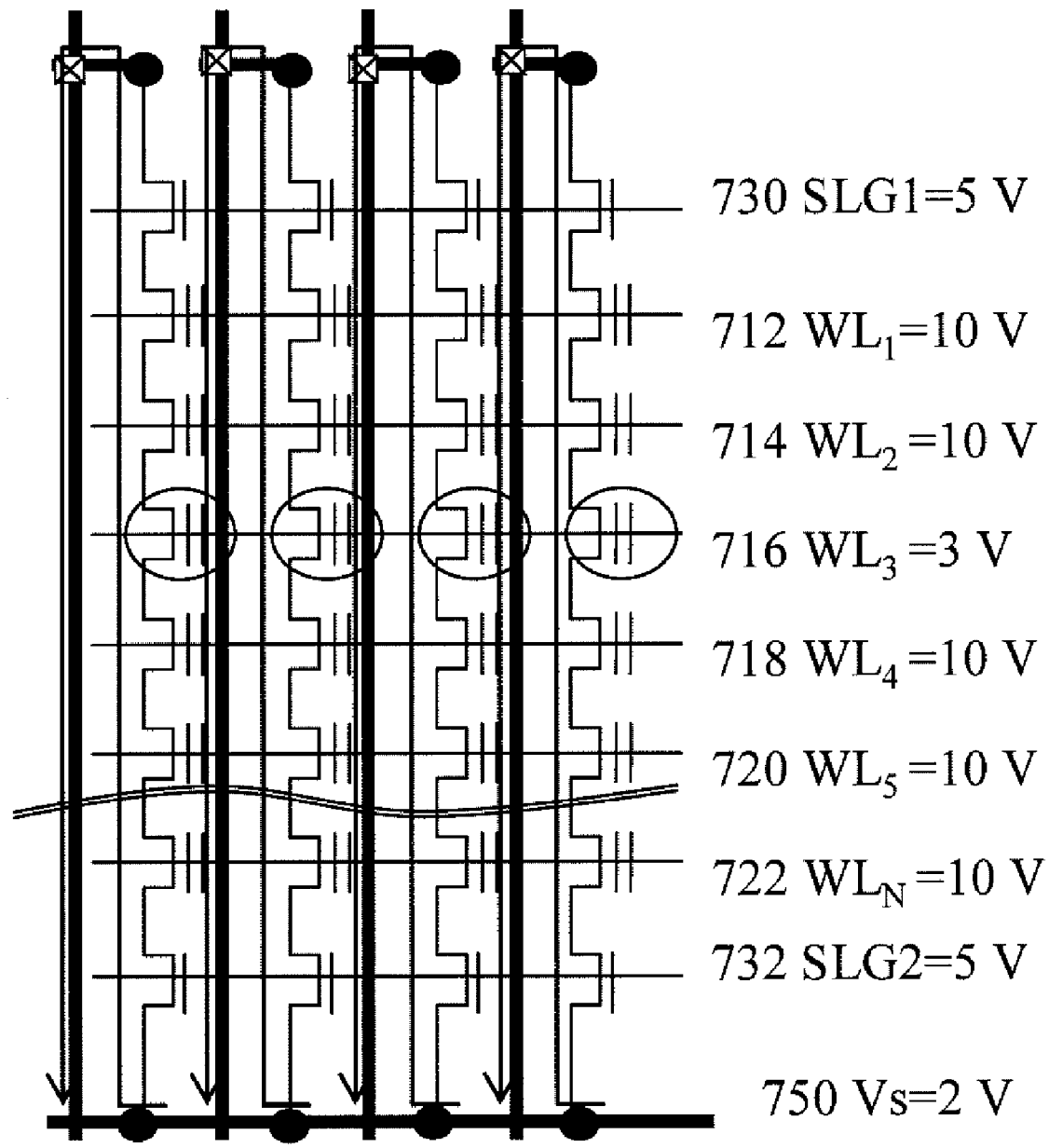
FIG. 7 shows an array of multiple NAND strings with nonvolatile charge trapping memory cells that have at most a single charge storage state undergoing a read operation with current flowing from the common source voltage end to the bit line end of each string.

FIG. 7 shows an array of multiple NAND strings with nonvolatile charge trapping memory cells that have at most a single charge storage state undergoing a read operation with current flowing from the common source voltage end to the bit line end of each string. Each column of charge trapping memory cells has a first end terminating with a first row of select transistors SLG1 730 with gates biased at 5 V and having a second end terminating with a second row of select transistors SLG2 732 with gates biased at 5 V. The contents of the array are accessed via bit lines BL1 740 biased at 0 V, BL2 742 biased at 0 V, BL3 744 biased at 0 V, and BL4 746 biased at 0 V, each coupled to the first end of a corresponding column of charge trapping memory cells. The second ends of the columns of charge trapping memory cells are coupled to a voltage source 750 biased at 2 V. The four columns of charge trapping memory cells are also controlled by multiple rows of N word lines including WL1 712 biased at 10 V, WL2 714 biased at 10 V, WL3 716 biased at 3 V, WL4 718 biased at 10 V, WL5 720 biased at 10 V, and WLN 722 biased at 10 V. The selected word line is WL3 716. The unselected word lines, WL1 712, WL2 714, WL4 718, WL5 720, and WLN 722, and select transistor rows SLG1 and SLG2 are biased to pass the voltages of voltage source 750 and of the bit lines BL1 740, BL2 742, BL3 744, and BL4 746 to the selected word line of memory cells. The charge storage state of the memory cells of the selected word line WL3 716 are determined by the current flowing from the voltage source 750 to the bit lines BL1 740, BL2 742, BL3 744, and BL4 746.

Figure 8:
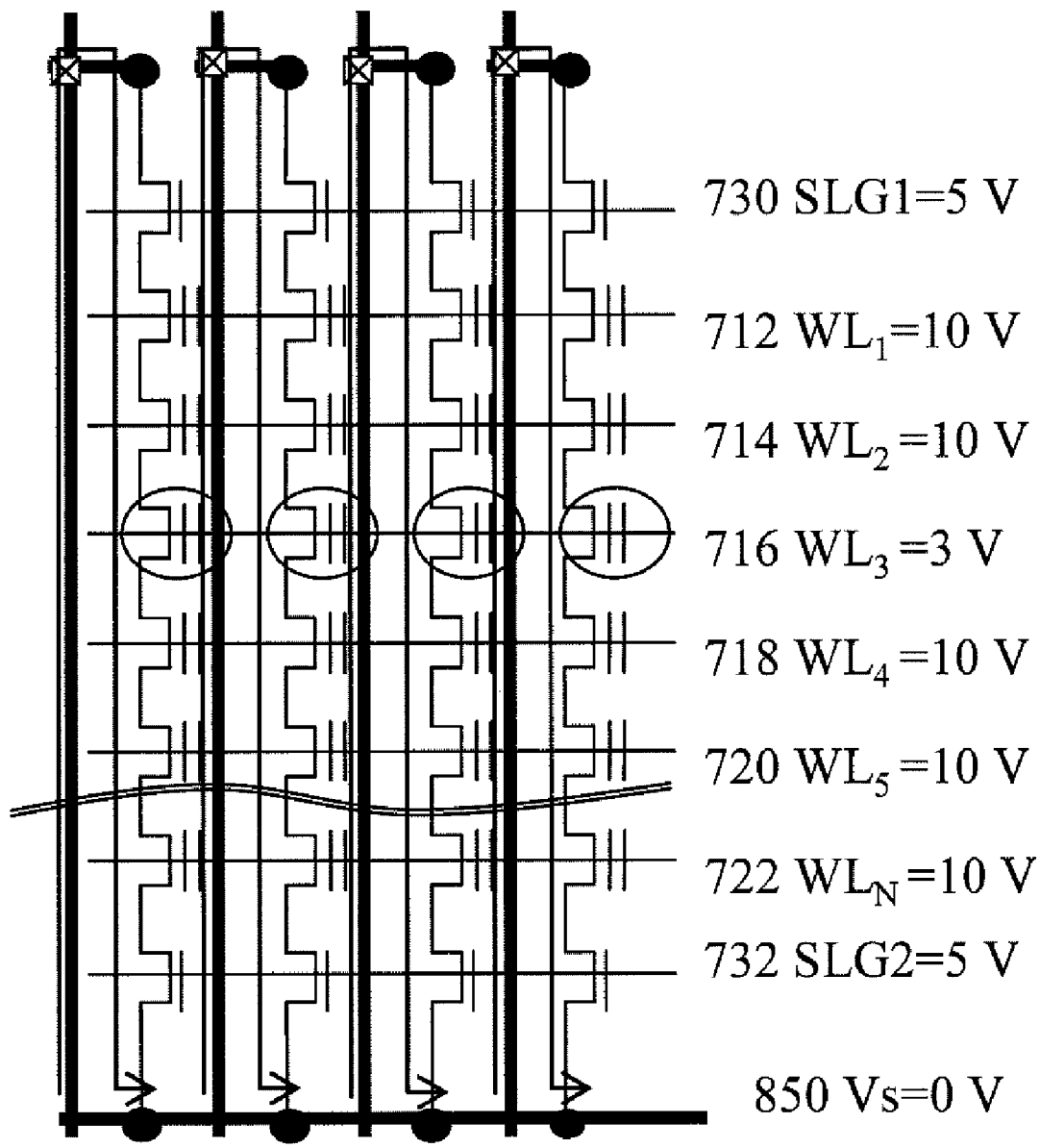
FIG. 8 shows an array of multiple NAND strings with nonvolatile charge trapping memory cells that have at most a single charge storage state undergoing a read operation similar to FIG. 7, but with current flowing from the bit line end to the common source voltage end of each string.

FIG. 8 shows an array of multiple NAND strings with nonvolatile charge trapping memory cells that have at most a single charge storage state undergoing a read operation similar to FIG. 7, but with current flowing from the bit line end to the common source voltage end of each string. The new bias arrangement includes bit lines BL1 840 biased at 2 V, BL2 842 biased at 2 V, BL3 844 biased at 2 V, and BL4 846 biased at 2 V. The new bias arrangement also includes the voltage source 850 biased at 0 V. The charge storage state of the memory cells of the selected word line WL3 716 are determined by the current flowing from the bit lines BL1 840, BL2 842, BL3 844, and BL4 846 to the voltage source 850.

Figure 9:
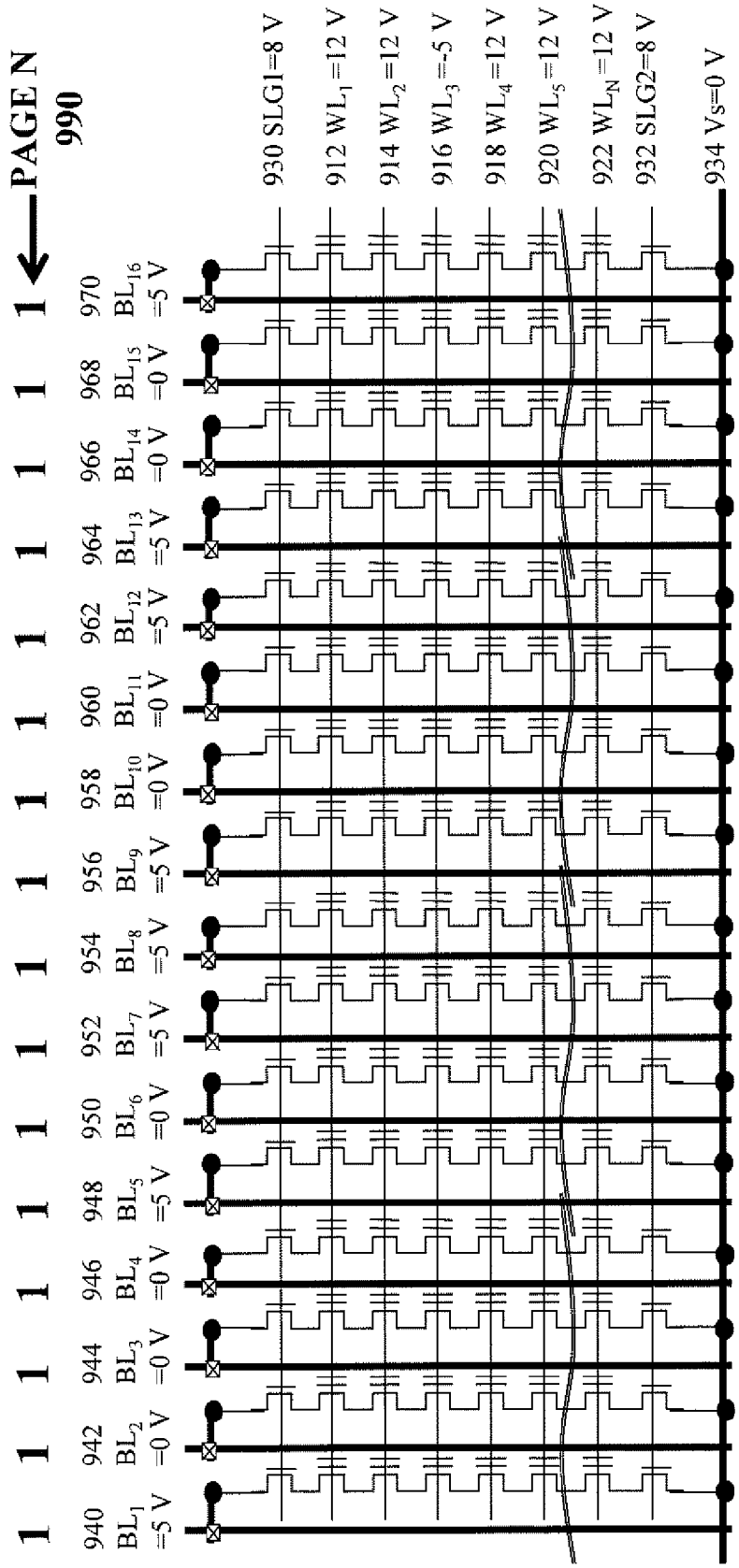
FIG. 9 shows an array of multiple NAND strings belonging to a single page with nonvolatile charge trapping memory cells that have at most a single charge storage state, undergoing a programming operation of the single page.

FIG. 9 shows an array of multiple NAND strings belonging to a single page with nonvolatile charge trapping memory cells that have at most a single charge storage state, undergoing a programming operation of the single page. Each column of charge trapping memory cells has a first end terminating with a first row of select transistors SLG1 930 with gates biased at 8 V and having a second end terminating with a second row of select transistors SLG2 932 with gates biased at 8 V. The contents of the array are accessed via bit lines BL1 940 biased at 5 V, BL2 942 biased at 0 V, BL3 944 biased at 0 V, BL4 946 biased at 0 V, BL5 948 biased at 5 V, BL6 950 biased at 0 V, BL7 952 biased at 5 V, BL8 954 biased at 5 V, BL9 956 biased at 5 V, BL10 958 biased at 0 V, BL11 960 biased at 0 V, BL12 962 biased at 5 V, BL13 964 biased at 5 V, BL14 966 biased at 0 V, BL15 968 biased at 0 V, and BL16 970 biased at 5 V, each coupled to the first end of a corresponding column of charge trapping memory cells. The second ends of the columns of charge trapping memory cells are coupled to a voltage source 934 biased at 0 V. The sixteen columns of charge trapping memory cells are also controlled by multiple rows of N word lines including WL1 912 biased at 12 V, WL2 914 biased at 12 V, WL3 916 biased at −5 V, WL4 918 biased at 12 V, WL5 920 biased at 12 V, and WLN 922 biased at 12 V. The selected word line is WL3 916. The unselected word lines, WL1 912, WL2 914, WL4 918, WL5 920, and WLN 922, and select transistor rows SLG1 and SLG2 are biased to pass the voltages of voltage source 934 and of the bit lines to the selected word line of memory cells. Because the shown memory cells belong to a single page as shown by the PAGE N 990 indicator, all columns are read or programmed in one operation.

Figure 10:
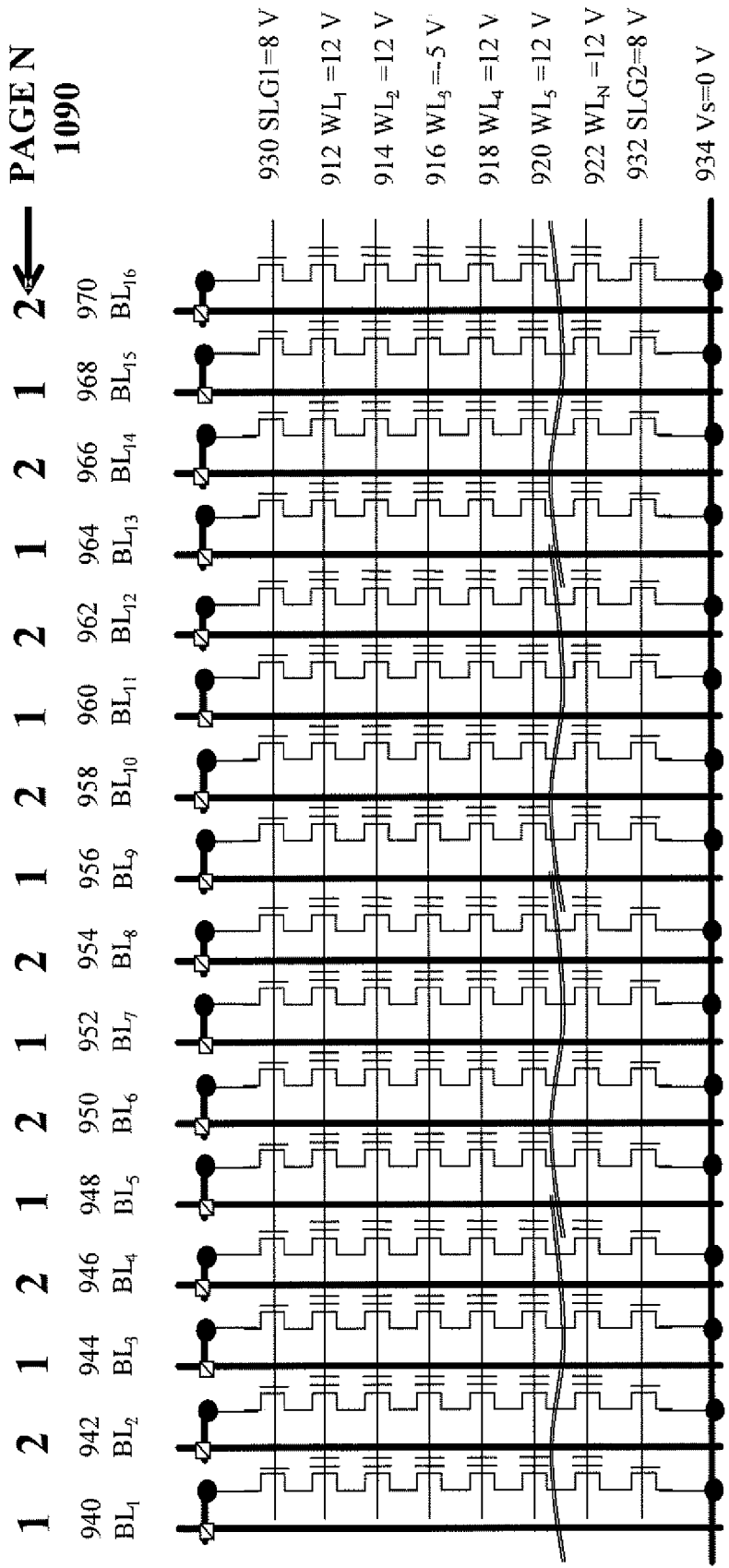
FIG. 10 shows an array of multiple NAND strings belonging to two pages with nonvolatile charge trapping memory cells that have at most a single charge storage state, undergoing a programming operation of one of the two pages.

FIG. 10 shows an array of multiple NAND strings belonging to two pages with nonvolatile charge trapping memory cells that have at most a single charge storage state, undergoing a programming operation of the two pages, one page at a time. Because the shown memory cells belong to two pages as shown by the PAGE N 1090 indicator, the columns in page 1 are programmed, and then the columns in page 2 are programmed. The bit line voltage arrangement depends on which bit lines contain cells selected by word lines to be programmed. None, some, or all of the bit lines in a particular page may contain cells selected to be programmed. The bit lines of an unselected page are all grounded. In the example shown in the table below, not all the columns in a particular page have a cell to be programmed.

| Bit Line | Page | BL Voltage PGM Page 1 | BL Voltage PGM Page 2 |
|---|---|---|---|
| 940 $BL_1$ | 1 | 5 | 0 |
| 942 $BL_2$ | 2 | 0 | 0 |
| 944 $BL_3$ | 1 | 0 | 0 |
| 946 $BL_4$ | 2 | 0 | 0 |
| 948 $BL_5$ | 1 | 5 | 0 |
| 950 $BL_6$ | 2 | 0 | 0 |
| 952 $BL_7$ | 1 | 5 | 0 |
| 954 $BL_8$ | 2 | 0 | 5 |
| 956 $BL_9$ | 1 | 5 | 0 |
| 958 $BL_{10}$ | 2 | 0 | 0 |
| 960 $BL_{11}$ | 1 | 0 | 0 |
| 962 $BL_{12}$ | 2 | 0 | 5 |
| 964 $BL_{13}$ | 1 | 5 | 0 |
| 966 $BL_{14}$ | 2 | 0 | 0 |
| 968 $BL_{15}$ | 1 | 0 | 0 |
| 970 $BL_{16}$ | 2 | 0 | 5 |

Figure 11:
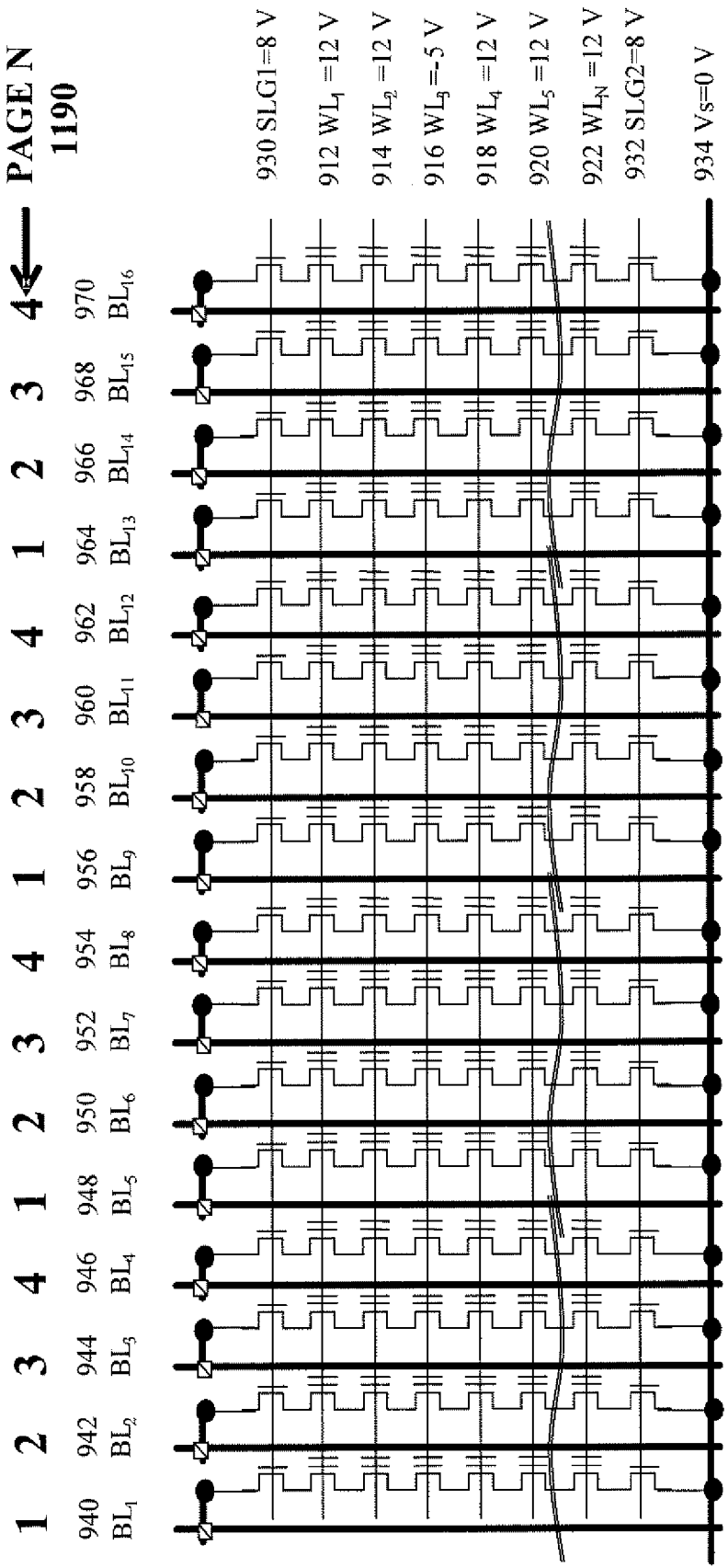
FIG. 11 shows an array of multiple NAND strings belonging to four pages with nonvolatile charge trapping memory cells that have at most a single charge storage state, undergoing a programming operation of one of the four pages.

FIG. 11 shows an array of multiple NAND strings belonging to four pages with nonvolatile charge trapping memory cells that have at most a single charge storage state, undergoing a programming operation of one of the four pages. Because the shown memory cells belong to four pages as shown by the PAGE N 1190 indicator, the columns in page 1 are programmed, then the columns in page 2 are programmed, then the columns in page 3 are programmed, and then the columns in page 4 are programmed. Other embodiments follow other permutations of page order, such as 4-3-2-1, 1-3-2-4, 1-4-2-3, etc. The bit line voltage arrangement depends on which bit lines contain cells selected by word lines to be programmed. None, some, or all of the bit lines in a particular page may contain cells selected to be programmed. The bit lines of an unselected page are all grounded. In the example shown in the table below, not all the columns in a particular page have a cell to be programmed.

| Bit Line | Page | BL Voltage PGM Page 1 | BL Voltage PGM Page 2 | BL Voltage PGM Page 3 | BL Voltage PGM Page 4 |
|---|---|---|---|---|---|
| 940 $BL_1$ | 1 | 5 | 0 | 0 | 0 |
| 942 $BL_2$ | 2 | 0 | 0 | 0 | 0 |
| 944 $BL_3$ | 3 | 0 | 0 | 5 | 0 |
| 946 $BL_4$ | 4 | 0 | 0 | 0 | 0 |
| 948 $BL_5$ | 1 | 5 | 0 | 0 | 0 |
| 950 $BL_6$ | 2 | 0 | 5 | 0 | 0 |
| 952 $BL_7$ | 3 | 0 | 0 | 5 | 0 |
| 954 $BL_8$ | 4 | 0 | 0 | 0 | 5 |
| 956 $BL_9$ | 1 | 5 | 0 | 0 | 0 |
| 958 $BL_{10}$ | 2 | 0 | 5 | 0 | 0 |
| 960 $BL_{11}$ | 3 | 0 | 0 | 0 | 0 |
| 962 $BL_{12}$ | 4 | 0 | 0 | 0 | 5 |
| 964 $BL_{13}$ | 1 | 5 | 0 | 0 | 0 |
| 966 $BL_{14}$ | 2 | 0 | 0 | 0 | 0 |
| 968 $BL_{15}$ | 3 | 0 | 0 | 5 | 0 |
| 970 $BL_{16}$ | 4 | 0 | 0 | 0 | 5 |

In other embodiments, there are M pages, where M is any integer less than or equal to the number of bit lines N.

FIG. 12A-C shows example flowcharts that implement algorithms for performing program and read operations on an array of multiple NAND strings belonging to N pages with nonvolatile charge trapping memory cells that have at most a single charge storage state.

FIG. 12A shows the flowchart of a first program algorithm. In the first program algorithm, N is incremented to the next page to be programmed after the current page is verified. After program start 1201, a memory pointer is set to page N 1203. At 1205, page N is programmed. At 1207, page N is verified. If verify fails, then programming page N at 1205 is repeated. If verify passes, then at 1209 a test is performed to see if N is the maximum page to be programmed. If N is not the maximum page to be programmed, then N is incremented and the algorithm returns to 1203. If N is the maximum page to be programmed, then the program algorithm ends at 1211.

FIG. 12B shows the flowchart of a second program algorithm, in which N is incremented through all pages to be programmed, and then all programmed pages are verified. After program start 1221, a memory pointer is set to page N 1223. At 1225, page N is programmed. At 1227 a test is performed to see if N is the maximum page to be programmed. If N is not the maximum page to be programmed, then N is incremented and the algorithm returns to 1225. If N is the maximum page to be programmed, then the algorithm proceeds to verify all programmed pages at 1229. If verify fails, then the algorithm returns to 1223. If verify passes, then the program algorithm ends at 1231.

FIG. 12C shows the flowchart of a read algorithm. After read start 1241, a memory pointer is set to page N 1243. At 1245, page N is read. At 1247 a test is performed to see if N is the maximum page to be read. If N is not the maximum page to be read, then N is incremented and the algorithm returns to 1243. If N is the maximum page to be read, then the read algorithm ends at 1249

Figure 13:
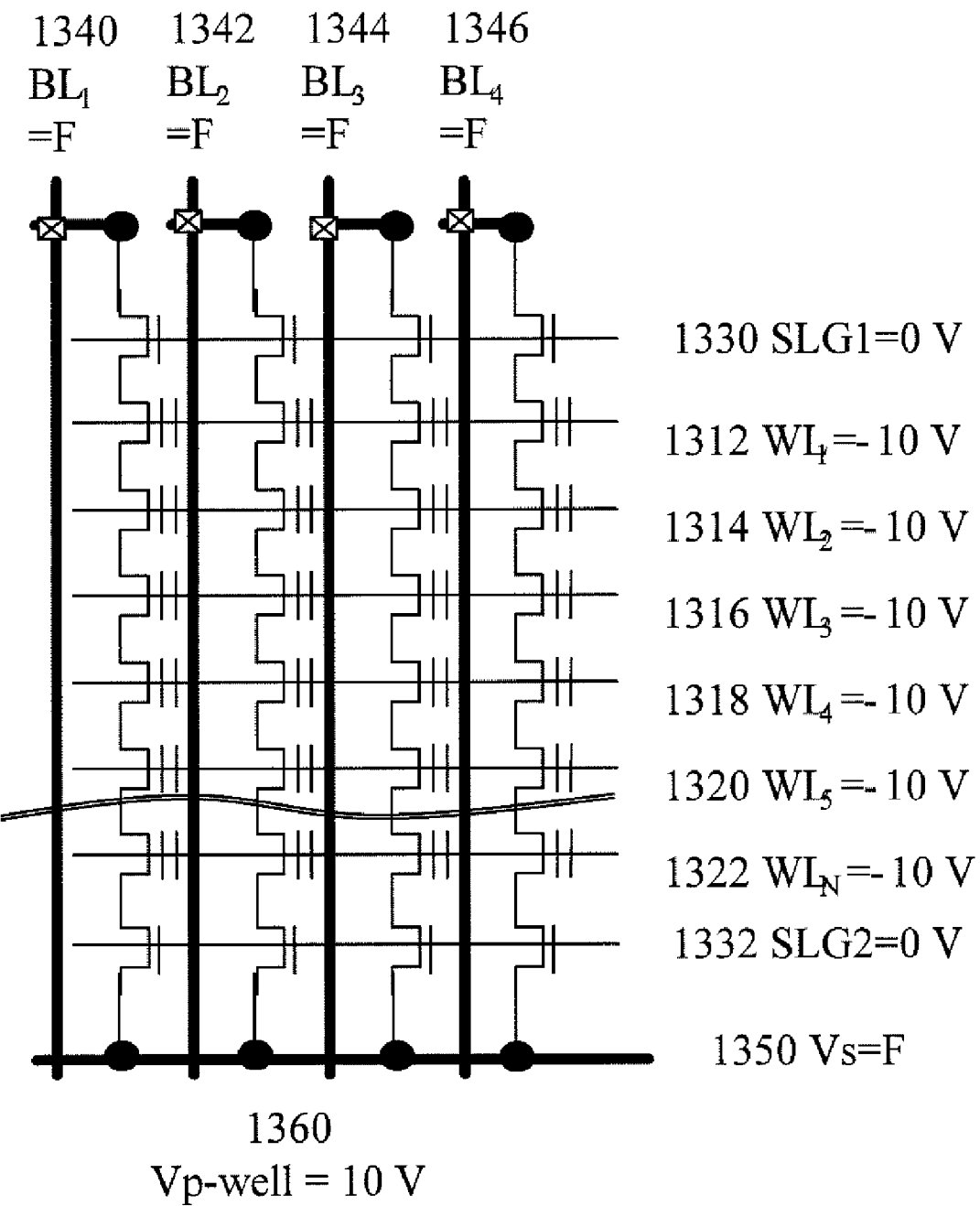
FIG. 13 shows an array of multiple NAND strings with nonvolatile charge trapping memory cells that have at most a single charge storage state undergoing an erase operation.

FIG. 13 shows an array of multiple NAND strings with nonvolatile charge trapping memory cells that have at most a single charge storage state undergoing an erase operation. Each column of charge trapping memory cells has a first end terminating with a first row of select transistors SLG1 1330 with gates biased at 0 V and having a second end terminating with a second row of select transistors SLG2 1332 with gates biased at 0 V. The bit lines include BL1 1340, BL2 1342, BL3 1344, and BL4 1346, all floating, and each coupled to the first end of a corresponding column of charge trapping memory cells. The second ends of the columns of charge trapping memory cells are coupled to a voltage source 1350 which is floating. The four columns of charge trapping memory cells are also controlled by multiple rows of N word lines including WL1 1312, WL2 1314, WL3 1316 biased, WL4 1318, WL5 1320, and WLN 1322, all biased at −10 V. The p-well 1360 is biased at 10 V.

Figure 14:
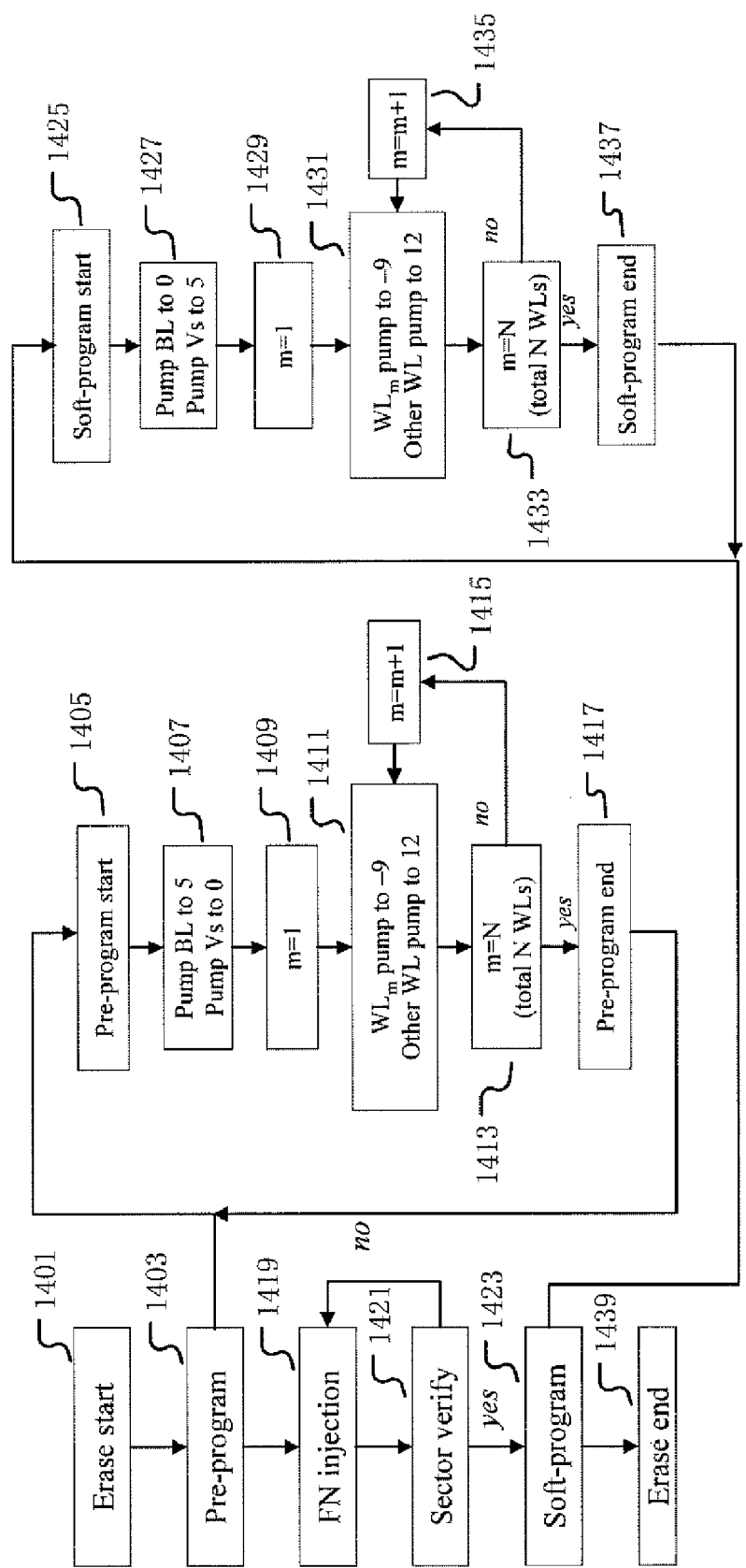
FIG. 14 shows an example flowchart that implements an algorithm for performing an erase operation on an array of multiple NAND strings with nonvolatile charge trapping memory cells that have at most a single charge storage state.

FIG. 14 shows an example flowchart that implements an algorithm for performing an erase operation on an array of multiple NAND strings with nonvolatile charge trapping memory cells that have at most a single charge storage state. After the erase algorithm starts at 1401, the pre-programming algorithm subroutine is performed. After the pre-programming subroutine starts at 1405, at 1407 bit lines are pumped to 5 V and the voltage source Vs remains at 0 V. At 1409, the word line pointer m is set to 1. At 1411, word line WLm is pumped to −9 V, while other word lines are pumped to 12 V. At 1413, a test is performed to see whether m equals N, where N is the total number of word lines. If m does not equal N, then m is incremented at 1415, and pre-programming continues at 1411. If m does equal N, then the pre-programming algorithm subroutine ends at 1417. After the pre-programming algorithm subroutine ends, then at 1419 Fowler-Nordheim injection is performed to erase the particular sector. At 1421, the erased sector is verified. If the sector erase verify fails, then the Fowler-Nordheim injection is repeated at 1419. If the sector erase verify passes, then the soft programming algorithm subroutine is performed. After the soft programming subroutine starts at 1425, at 1427 the voltage source VS is pumped to 5 V and the bit lines remain at 0 V. At 1429, the word line pointer m is set to 1. At 1431, word line WLm is pumped to −9 V, while other word lines are pumped to 12 V. At 1433, a test is performed to see whether m equals N, where N is the total number of word lines. If m does not equal N, then m is incremented at 1435, and soft programming continues at 1431. If m does equal N, then the soft programming algorithm subroutine ends at 1437. After the soft programming algorithm subroutine ends, then the erase algorithm ends at 1439.

Figure 15A:
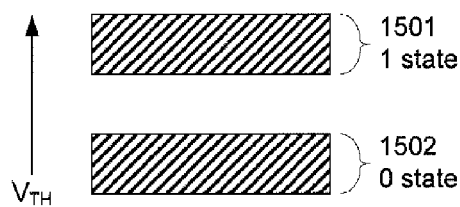
FIGS. 15A-D are threshold voltage state illustrations that show the single charge storage state storing one of two, four, eight, and sixteen logical states.
Figure 15B:
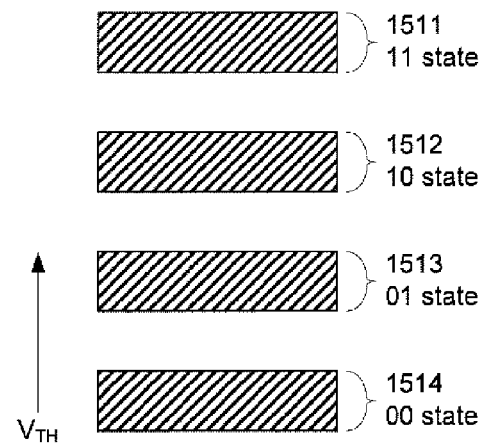
Figure 15C:
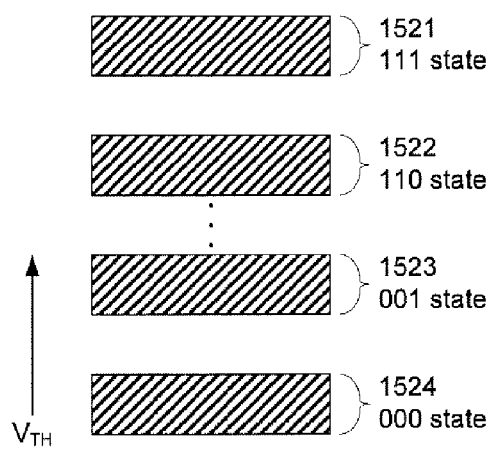
Figure 15D:
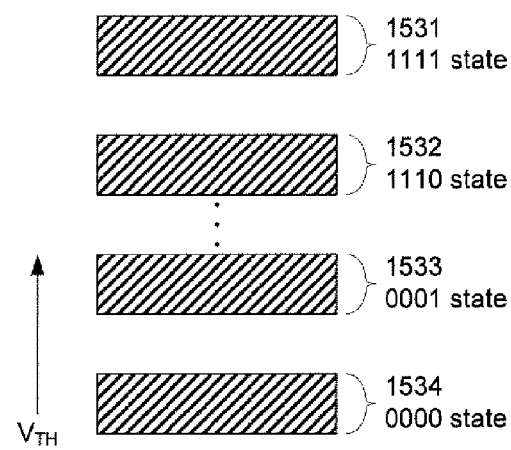

FIGS. 15A-D are threshold voltage state illustrations that show the single charge storage state storing one of two, four, eight, and sixteen logical states. FIGS. 15A, 15B, 15C, and 15D are threshold state schematics corresponding to 1 bit, 2 bits, 3 bits, and 4 bits, respectively. FIG. 15A shows a schematic for two-level threshold state operation. There are two states, the 1 state 1501 and the 0 state 1502. FIG. 15B shows a schematic for four-level threshold state operation. There are 4 states, the 11 state 1511, the 10 state 1512, the 01 state 1513, and the 00 state 1514. FIG. 15C shows a schematic for 8-level threshold state operation. There are 8 states, of which 4 states are shown, the 111 state 1521, the 110 state 1522, the 001 state 1523, and the 000 state 1524. FIG. 15D shows a schematic for 16-level threshold state operation. There are 16 states, of which 4 states are shown, the 1111 state 1531, the 1110 state 1532, the 0001 state 1533, and the 0000 state 1534. The threshold state schematics of FIGS. 15B, 15C, and 15D show possible implementations of multi-level cell applications, applied to the single charge storage state of a memory cell. Different carrier movement processes can be applied for different parts of the threshold voltage region. For example, carrier movement processes that program via hole injection can program the threshold states with lower threshold voltages, carrier movement processes that program via electron injection can program the threshold states with higher threshold voltages, and a reset process can program a threshold states with an intermediate threshold voltage.

Figure 16A:
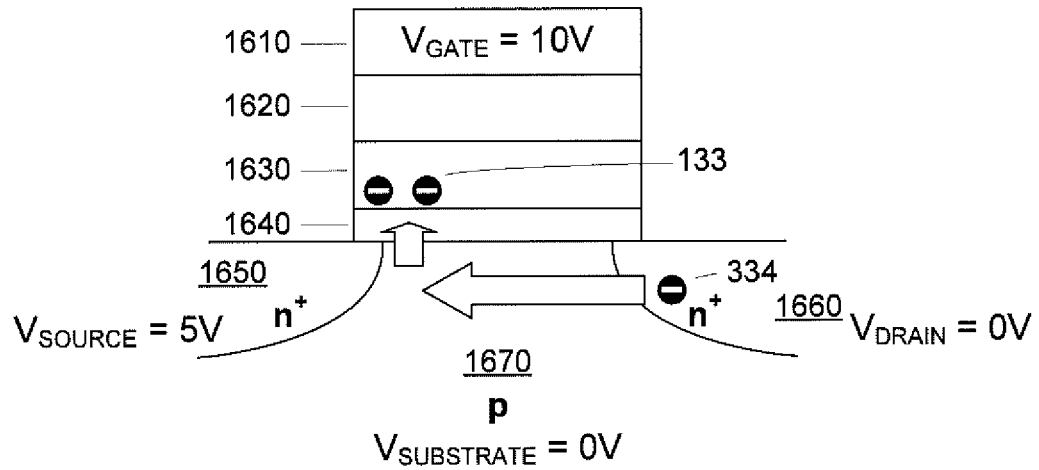
FIGS. 16A and 16B are simplified diagrams of a charge trapping memory cell, showing channel hot electron injection being performed to program at most one charge storage state in the charge trapping memory cell.
Figure 16B:
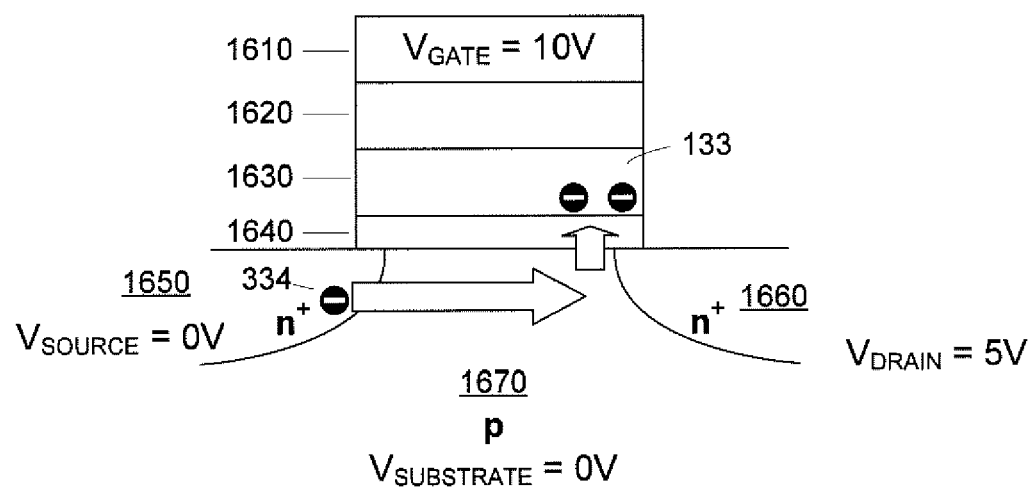

FIGS. 16A and 16B are simplified diagrams of a charge trapping memory cell, showing channel hot electron injection being performed on one portion of the charge trapping structure to program at most one charge storage state in the charge trapping memory cell.

The p-doped substrate region 1670 includes n+ doped source and drain regions 1650 and 1660. The remainder of the memory cell includes a bottom dielectric structure 1640 on the substrate, a charge trapping structure 1630 on the bottom dielectric structure 1640 (bottom oxide), a top dielectric structure 1620 (top oxide) on the charge trapping structure 1630, and a gate 1610 on the oxide structure 1620. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru—Ti and Ni—Ti, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the bias arrangement of FIG. 16A for adding electrons 133 to the source side of the charge trapping structure 1630, the voltage of the gate 1610 is 10 V, the voltage of the source 1650 is 5 V, the voltage of the drain 1660 is 0 V, and the voltage of the substrate 1670 is 0 V. The memory cell of FIG. 16B is similar to memory cell of FIG. 16A, except that electrons 133 are added to the drain side of the charge trapping structure rather than on the source side. In the bias arrangement of FIG. 16B, the voltage of the gate 1610 is 10 V, the voltage of the source 1650 is 0 V, the voltage of the drain 1660 is 5 V, and the voltage of the substrate 1670 is 0 V.

Figure 17A:
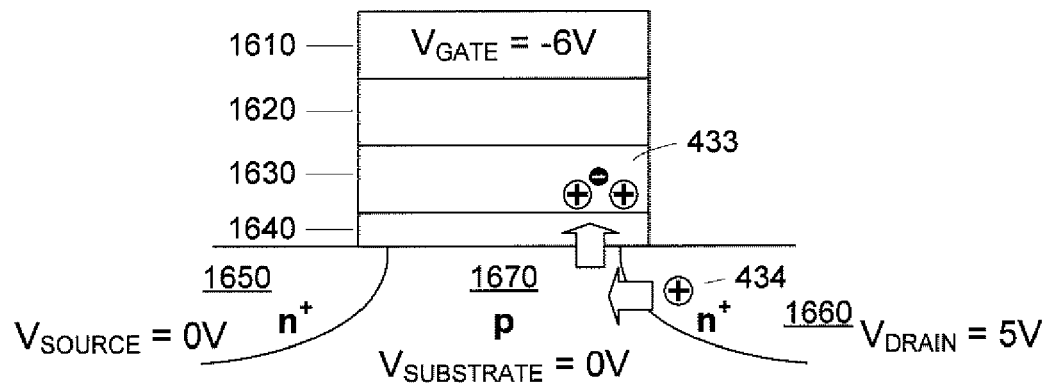
FIGS. 17A and 17B are simplified diagrams of a charge trapping memory cell, showing band to band hot hole injection being performed to program at most one charge storage state in the charge trapping memory cell.
Figure 17B:
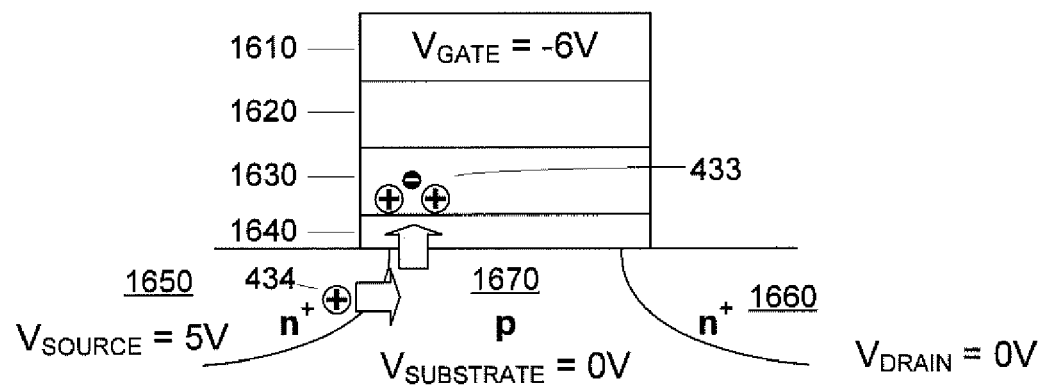

FIGS. 17A and 17B are simplified diagrams of a charge trapping memory cell, showing band to band hot hole injection being performed on the charge trapping structure to program at most one charge storage state in the charge trapping memory cell. In the bias arrangement of FIG. 17A for adding holes 433 to the drain side of the charge trapping structure 1630, the voltage of the gate 1610 is −6 V, the voltage of the source 1650 is 0 V, the voltage of the drain 1660 is 5 V, and the voltage of the substrate 1670 is 0 V. The memory cell of FIG. 17B is similar to memory cell of FIG. 17A, except that holes 433 are added to the source side of the charge trapping structure rather than on the drain side. In the bias arrangement of FIG. 177B, the voltage of the gate 1610 is −6 V, the voltage of the source 1650 is 5 V, the voltage of the drain 1660 is 0 V, and the voltage of the substrate 1670 is 0 V. In the simplified diagrams of FIGS. 17A and 17B, the stored charge 433 in the charge trapping structure, electrons are symbolically shown smaller than the holes to show that the injected holes have erased previously programmed electrons.

In some embodiments, programming refers to making more positive the net charge stored in the charge trapping structure, such as by the addition of holes to or the removal of electrons from the charge trapping; and erasing refers to making more negative the net charge stored in the charge trapping structure, such as by the removal of holes from or the addition of electrons to the charge trapping structure. However, in other embodiments programming refers to making the net charge stored in the charge trapping structure more negative, and erasing refers to making the net charge stored in the charge trapping structure more positive. Various charge movement mechanisms are sued, such as band-to-band tunneling induced hot carrier injection, E-field induced tunneling, channel hot carrier injection, channel initiated substrate carrier injection, and direct tunneling from the substrate.

Figure 18A:
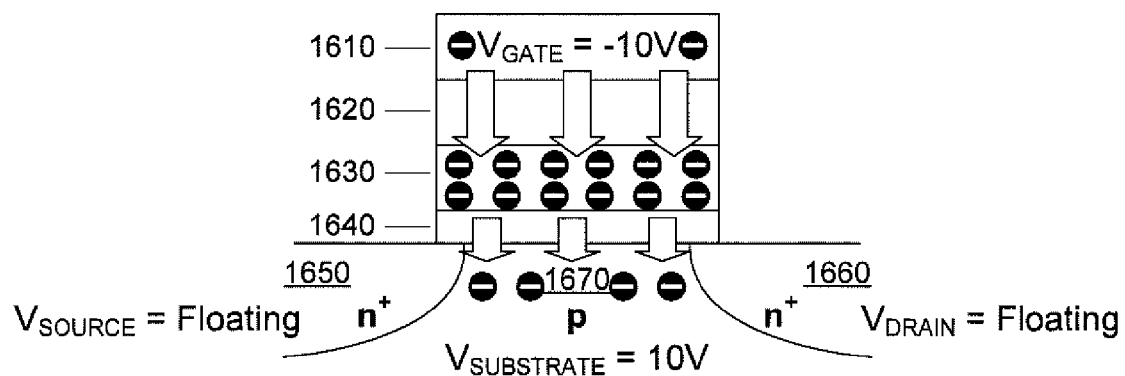
FIGS. 18A and 18B are simplified diagrams of a charge trapping memory cell, showing en erase operation being performed on the charge trapping structure to reset the at most one charge storage state in the charge trapping memory cell.
Figure 18B:
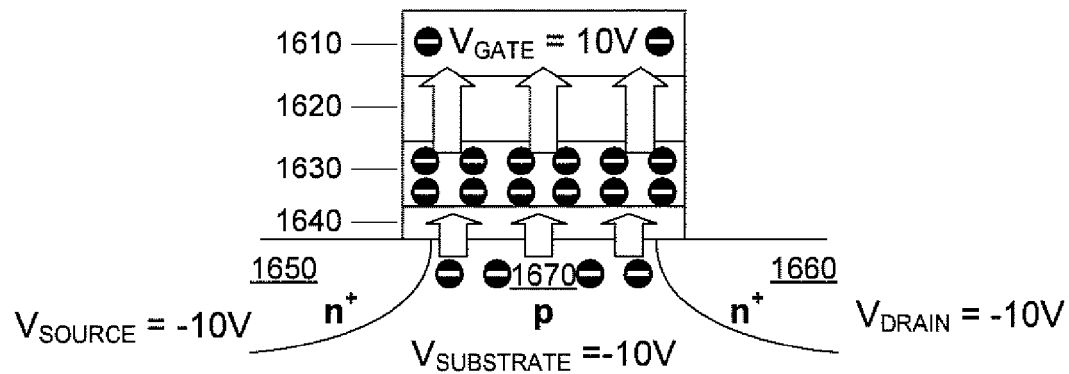

FIGS. 18A and 18B are simplified diagrams of a charge trapping memory cell, showing en erase operation being performed on the charge trapping structure to reset the at most one charge storage state in the charge trapping memory cell. In the bias arrangement of FIG. 18A for erasing the memory cell, the voltage of the gate 1610 is −10 V, the voltage of the source 1650 and the drain 1660 is floating, and the voltage of the substrate 1610 is 10 V. The erase operation of FIG. 18A corresponds to the erase operation of FIG. 13. The memory cell of FIG. 18B is similar to memory cell of FIG. 18A, except for the direction of movement of the electrons. In the bias arrangement of FIG. 18B, the voltage of the gate 1610 is 10 V; and the voltages of the source 1650, the drain 1660, and the voltage of the substrate 1670 are −10 V. This voltage arrangement with a negative voltage on the source, drain, and substrate results in good electron injection efficiency and erasure speed. In another embodiment, the voltages of the source 1650 and the drain 1660 are floating.

Figure 19:
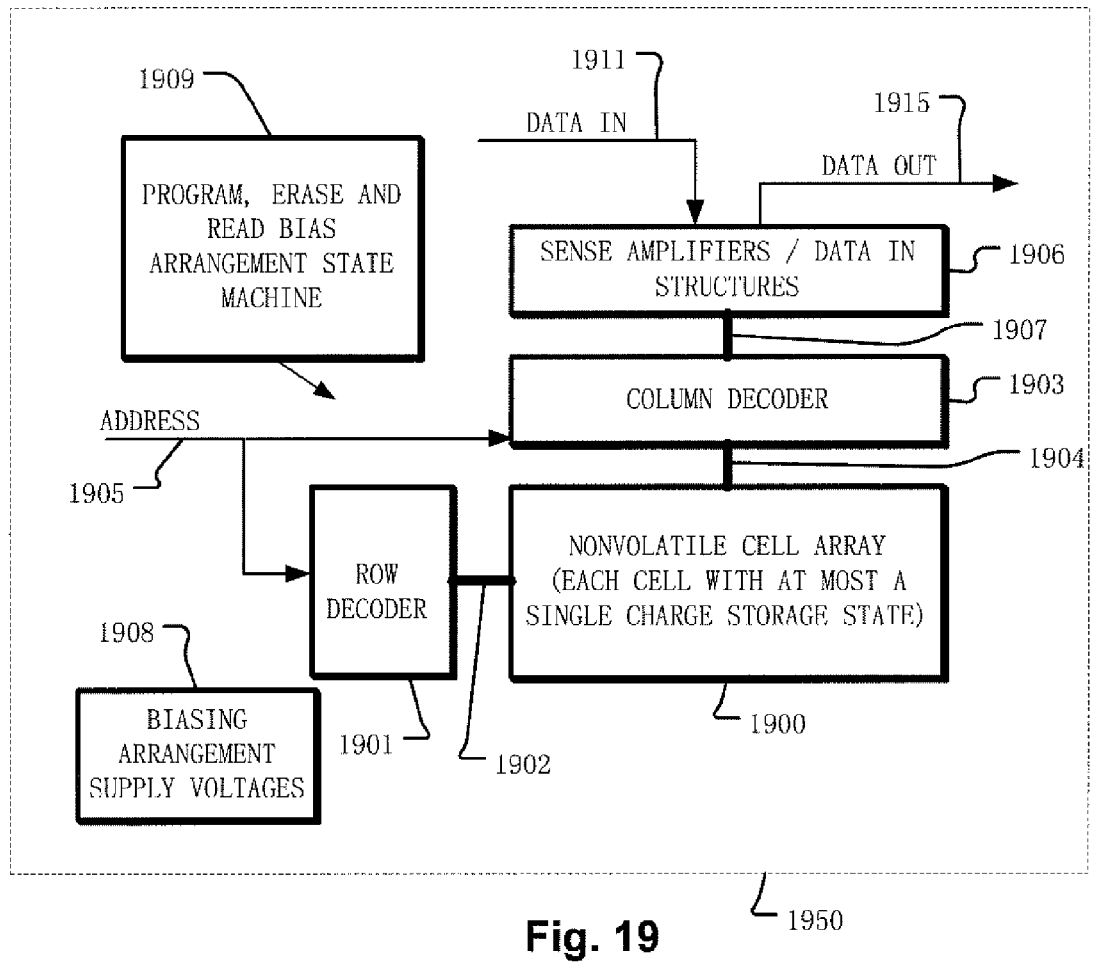
FIG. 19 is a simplified diagram of an integrated circuit with an array of charge trapping memory cells and control circuitry.

FIG. 19 is a simplified block diagram of an integrated circuit according to an embodiment. The integrated circuit 1950 includes a memory array 1900 implemented using charge trapping memory cells each having at most a single charge storage state, on a semiconductor substrate. A row decoder 1901 is coupled to a plurality of word lines 1902 arranged along rows in the memory array 1900. A column decoder 1903 is coupled to a plurality of bit lines 1904 arranged along columns in the memory array 1900. Addresses are supplied on bus 1905 to column decoder 1903 and row decoder 1901. Sense amplifiers and data-in structures in block 1906 are coupled to the column decoder 1903 via data bus 1907. Data is supplied via the data-in line 1911 from input/output ports on the integrated circuit 1950, or from other data sources internal or external to the integrated circuit 1950, to the data-in structures in block 1906. Data is supplied via the data-out line 1915 from the sense amplifiers in block 1906 to input/output ports on the integrated circuit 1950, or to other data destinations internal or external to the integrated circuit 1950. A bias arrangement state machine 1909 controls the application of bias arrangement supply voltages 1908, such as for the erase verify and program verify voltages, and the arrangements for programming, erasing, and reading the memory cells.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory, comprising:
a memory array including a plurality of columns, each column of the plurality of columns including a plurality of memory cells arranged in a series having a first end and a second end, each memory cell of the plurality of memory cells having at most a single charge storage state, each memory cell of the plurality of memory cells including:
a substrate region including source and drain regions;
a charge trapping structure storing the single charge storage state represented by a particular amount of charge at a particular part of the charge trapping structure;
one or more storage dielectric structures at least partly between the charge trapping structure and the substrate region, and at least partly between the charge trapping structure and a source of gate voltage;
a plurality of word lines coupled to said storage dielectric structures, the plurality of word lines acting as the source of gate voltage to the memory array; and
logic coupled to the plurality of memory cells, said logic applying bias arrangements to the memory array to program, erase, and read the memory array.

2. The memory of claim 1, further comprising:
a plurality of bit lines, each bit line of the plurality of bit lines coupled to the first end of a corresponding column of the plurality of columns
wherein the logic applies a program bias arrangement to the memory array to program memory cells of the memory array in multiple columns of the plurality of columns.

3. The memory of claim 1, further comprising:
a plurality of bit lines, each bit line of the plurality of bit lines coupled to the first end of a corresponding column of the plurality of columns
wherein the logic applies a read bias arrangement to the memory array to read memory cells of the memory array in multiple columns of the plurality of columns.

4. The memory of claim 1, further comprising:
a plurality of bit lines, each bit line of the plurality of bit lines coupled to the first end of a corresponding column of the plurality of columns, wherein the plurality of bit lines is divided into a plurality of pages, and each page of the plurality of pages includes memory cells accessed by any bit line in said each page,
wherein the logic applies a program bias arrangement to the memory array to program memory cells of the memory array in at least one page of the plurality of pages.

5. The memory of claim 1, further comprising:
a plurality of bit lines, each bit line of the plurality of bit lines coupled to the first end of a corresponding column of the plurality of columns, wherein the plurality of bit lines is divided into a plurality of pages, and each page of the plurality of pages includes memory cells accessed by any bit line in said each page, wherein the logic applies a read bias arrangement to the memory array to read memory cells of the memory array in at least one page of the plurality of pages.

6. The memory of claim 1, further comprising:
a plurality of bit lines, each bit line of the plurality of bit lines coupled to the first end of a corresponding column of the plurality of columns; and
a voltage source coupled to the second end of each column of the plurality of columns, wherein the logic determines the single charge storage state of memory cells of the memory array by sensing current in the plurality of bit lines.

7. The memory of claim 1, wherein the plurality of memory cells are n-channel devices.

8. The memory of claim 1, wherein the plurality of memory cells are p-channel devices.

9. The memory of claim 1, wherein the logic applies a program bias arrangement to the memory array to program memory cells of the memory array via hot hole injection.

10. The memory of claim 1, wherein the logic applies a program bias arrangement to the memory array to program memory cells of the memory array via electron injection.

11. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a direction from the first end of the columns to the second end of the columns but not along a direction from the second end of the columns to the first end of the columns.

12. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a direction from the second end of the columns to the first end of the columns but not along a direction from the first end of the columns to the second end of the columns.

13. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a first direction from the first end of the columns to the second end of the columns and a second direction from the second end of the columns to the first end of the columns.

14. The memory of claim 1, wherein the single charge storage state stores one of two logical states.

15. The memory of claim 1, wherein the single charge storage state stores one of at least four logical states.

16. The memory of claim 1, further comprising:
a plurality of bit lines, each bit line of the plurality of bit lines coupled to the first end of a corresponding column of the plurality of columns; and
wherein the logic determines the single charge storage state of memory cells of the memory array by sensing current in the plurality of bit lines, said current flowing from the first end to the second end of the columns.

17. The memory of claim 1, further comprising:
a plurality of bit lines, each bit line of the plurality of bit lines coupled to the first end of a corresponding column of the plurality of columns; and
wherein the logic determines the single charge storage state of memory cells of the memory array by sensing current in the plurality of bit lines, said current flowing from the second end to the first end of the columns.

18. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a direction from the first end of the columns to the second end of the columns but not along a direction from the second end of the columns to the first end of the columns, and band-to-band hot holes are injected into the charge trapping structure of the cells undergoing programming.

19. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a direction from the second end of the columns to the first end of the columns but not along a direction from the first end of the columns to the second end of the columns, and band-to-band hot holes are injected into the charge trapping structure of the cells undergoing programming.

20. The memory of claim 1, further comprising:
a plurality of bit lines, each bit line of the plurality of bit lines coupled to the first end of a corresponding column of the plurality of columns,
wherein the logic applies a program bias arrangement to the memory array to program memory cells of the memory array via injection of carriers along a first direction from the first end of the columns to the second end of the columns and a second direction from the second end of the columns to the first end of the columns, and band-to-band hot holes are injected into the charge trapping structure of the cells undergoing programming.

21. A method of operating nonvolatile memory, comprising:
applying bias arrangements to a memory array including a plurality of columns, each column of the plurality of columns including a plurality of charge trapping memory cells arranged in a series having a first end and a second end, each charge trapping memory cell of the plurality of charge trapping memory cells having at most a single charge storage state represented by a particular amount of charge at a particular part of a charge trapping structure of the charge trapping memory cell, including:
applying a program bias arrangement to the memory array to program at most the single charge storage state for any memory cell of the memory array; and
applying a read bias arrangement to the memory array to read at most the single charge storage state for any memory cell of the memory array.

22. The method of claim 21, wherein the program bias arrangement is applied to the memory array to program memory cells of the memory array in multiple columns of the plurality of columns, wherein the plurality of columns is coupled to a plurality of bit lines, such that each bit line of the plurality of bit lines is coupled to the first end of a corresponding column of the plurality of columns.

23. The method of claim 21, wherein the read bias arrangement is applied to the memory array to read memory cells of the memory array in multiple columns of the plurality of columns, wherein the plurality of columns is coupled to a plurality of bit lines, such that each bit line of the plurality of bit lines is coupled to the first end of a corresponding column of the plurality of columns.

24. The method of claim 21, wherein the program bias arrangement is applied to the memory array to program memory cells of the memory array in at least one page of a plurality of pages, wherein the plurality of columns is coupled to a plurality of bit lines, such that each bit line of the plurality of bit lines is coupled to the first end of a corresponding column of the plurality of columns, and the plurality of bit lines is divided into the plurality of pages.

25. The method of claim 21, wherein the read bias arrangement is applied to the memory array to read memory cells of the memory array in at least one page of a plurality of pages, wherein the plurality of columns is coupled to a plurality of bit lines, such that each bit line of the plurality of bit lines is coupled to the first end of a corresponding column of the plurality of columns, and the plurality of bit lines is divided into the plurality of pages.

26. The method of claim 21, further comprising:
   supplying a same voltage to the second end of each column of the plurality of columns; and
   determining the single charge storage state of memory cells of the memory array by sensing current in a plurality of bit lines, wherein the plurality of columns is coupled to a plurality of bit lines, such that each bit line of the plurality of bit lines, is coupled to the first end of a corresponding column of the plurality of columns.

27. The method of claim 21, wherein the plurality of memory cells are n-channel devices.

28. The method of claim 21, wherein the plurality of memory cells are p-channel devices.

29. The method of claim 21, wherein the program bias arrangement programs memory cells of the memory array via hot hole injection.

30. The method of claim 21, wherein the program bias arrangement program memory cells of the memory array via electron injection.

31. The method of claim 21, wherein the program bias arrangement is applied to the memory array to program memory cells of the memory array via injection of carriers along a direction from the first end of the columns to the second end of the columns but not along a direction from the second end of the columns to the first end of the columns, wherein the plurality of columns is coupled to a plurality of bit lines, such that each bit line of the plurality of bit lines is coupled to the first end of a corresponding column of the plurality of columns.

32. The method of claim 21, wherein the program bias arrangement is applied to the memory array to program memory cells of the memory array via injection of carriers along a direction from the second end of the columns to the first end of the columns but not along a direction from the first end of the columns to the second end of the columns, wherein the plurality of columns is coupled to a plurality of bit lines, such that each bit line of the plurality of bit lines is coupled to the first end of a corresponding column of the plurality of columns.

33. The method of claim 21, wherein the program bias arrangement is applied to the memory array to program memory cells of the memory array via injection of carriers along a direction from the second end of the columns to the first end of the columns and along a direction from the first end of the columns to the second end of the columns, wherein the plurality of columns is coupled to a plurality of bit lines, such that each bit line of the plurality of bit lines is coupled to the first end of a corresponding column of the plurality of columns.

34. The method of claim 21, wherein the single charge storage state stores one of two logical states.

35. The method of claim 21, wherein the single charge storage state stores one of at least four logical states.

36. A method of manufacturing a nonvolatile memory, comprising:
   providing a memory array including a plurality of columns, each column of the plurality of columns including a plurality of memory cells arranged in a series having a first end and a second end, each memory cell of the plurality of memory cells having at most a single charge storage state, each memory cell of the plurality of memory cells including:
      a substrate region including source and drain regions;
      a charge trapping structure storing the single charge storage state represented by a particular amount of charge at a particular part of the charge trapping structure;
      one or more storage dielectric structures at least partly between the charge trapping structure and the substrate region, and at least partly between the charge trapping structure and a source of gate voltage;
   providing a plurality of word lines coupled to said storage dielectric structures, the plurality of word lines acting as the source of gate voltage to the memory array; and
   providing logic coupled to the plurality of memory cells, said logic applying bias arrangements to the memory array to program, erase, and read the memory array.

* * * * *